(12) United States Patent
Suzuki et al.

(10) Patent No.: US 12,325,816 B2
(45) Date of Patent: *Jun. 10, 2025

(54) OPTICALLY ANISOTROPIC LAYER, OPTICAL FILM, POLARIZING PLATE, AND IMAGE DISPLAY DEVICE

(71) Applicant: FUJIFILM Corporation, Tokyo (JP)

(72) Inventors: Masaaki Suzuki, Kanagawa (JP); Yuki Nakamura, Kanagawa (JP); Shunya Katoh, Kanagawa (JP); Hiroshi Inada, Kanagawa (JP); Yuki Fukushima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 150 days.

This patent is subject to a terminal disclaimer.

(21) Appl. No.: 17/701,161

(22) Filed: Mar. 22, 2022

(65) Prior Publication Data

US 2022/0228064 A1    Jul. 21, 2022

Related U.S. Application Data

(63) Continuation of application No. PCT/JP2020/036190, filed on Sep. 25, 2020.

(30) Foreign Application Priority Data

Sep. 27, 2019   (JP) .................................. 2019-177734

(51) Int. Cl.
*C09K 19/34* (2006.01)
*C09K 19/02* (2006.01)
(Continued)

(52) U.S. Cl.
CPC .......... *C09K 19/3491* (2013.01); *C09K 19/02* (2013.01); *C09K 19/04* (2013.01);
(Continued)

(58) Field of Classification Search
CPC ..................................................... C09K 19/20
See application file for complete search history.

(56) References Cited

U.S. PATENT DOCUMENTS

| 10,473,820 B2* | 11/2019 | Yamamoto ........... C09D 135/02 |
| 2015/0079380 A1* | 3/2015 | Muramatsu ........ C09K 19/2028 |
| | | 252/299.61 |

(Continued)

FOREIGN PATENT DOCUMENTS

| CN | 104950371 A * | 9/2015 | ......... C09K 19/2007 |
| CN | 104950373 A | 9/2015 | |

(Continued)

OTHER PUBLICATIONS

International Search Report issued in PCT/JP2020/036190 on Dec. 15, 2020.

(Continued)

*Primary Examiner* — Chanceity N Robinson
(74) *Attorney, Agent, or Firm* — Edwards Neils LLC; Jean C. Edwards, Esq.

(57) ABSTRACT

An optically anisotropic layer having an excellent surface condition, with which an image display device having an excellent contrast can be manufactured; and an optical film, a polarizing plate, and an image display device, each having the optically anisotropic layer. The optically anisotropic layer is obtained by immobilizing a polymerizable liquid crystal composition including a polymerizable rod-shaped liquid crystal compound exhibiting a liquid crystal state of a smectic phase and an additive in a liquid crystal state of a smectic phase, in which a molecular length A (Å) of the polymerizable rod-shaped liquid crystal compound, a layer interval B (Å) of the smectic phase of the optically aniso- (Continued)

tropic layer, and a molecular length C (Å) of the additive satisfy a relationship of Expression (1-1), $0.5 \times B \leq C \leq 0.6 \times A$ ... (1-1).

14 Claims, 1 Drawing Sheet

(51) Int. Cl.
  *C09K 19/04* (2006.01)
  *C09K 19/20* (2006.01)
  *C09K 19/30* (2006.01)
  *G02F 1/1335* (2006.01)
  *H10K 59/80* (2023.01)

(52) U.S. Cl.
  CPC ...... *C09K 19/2007* (2013.01); *C09K 19/3068* (2013.01); *G02F 1/133528* (2013.01); *C09K 2019/0448* (2013.01); *C09K 2019/2078* (2013.01); *C09K 2019/3075* (2013.01); *G02F 2202/022* (2013.01); *H10K 59/8791* (2023.02)

(56) References Cited

U.S. PATENT DOCUMENTS

| | | | |
|---|---|---|---|
| 2015/0277006 A1* | 10/2015 | Takasago | C09K 19/601 |
| | | | 349/194 |
| 2015/0277007 A1 | 10/2015 | Matsuyama et al. | |
| 2016/0068756 A1 | 3/2016 | Moriya et al. | |
| 2017/0349828 A1* | 12/2017 | Katoh | C08F 228/00 |
| 2019/0264106 A1 | 8/2019 | Takahashi et al. | |
| 2020/0010209 A1 | 1/2020 | Bender | |
| 2020/0109333 A1* | 4/2020 | Akutagawa | C09K 19/3068 |
| 2020/0292861 A1 | 9/2020 | Iwasaki et al. | |
| 2020/0392408 A1 | 12/2020 | Shibata et al. | |
| 2022/0011488 A1 | 1/2022 | Yamamoto et al. | |

FOREIGN PATENT DOCUMENTS

| | | | |
|---|---|---|---|
| CN | 110023347 A | 7/2019 | |
| JP | 2015-200861 A | 11/2015 | |
| JP | 2016-051178 A | 4/2016 | |
| WO | 2016/143883 A1 | 9/2016 | |
| WO | WO-2019009255 A1 * | 1/2019 | ............ B32B 27/30 |
| WO | 2019/124439 A1 | 6/2019 | |
| WO | 2019/167926 A1 | 9/2019 | |
| WO | 2020/203491 A1 | 10/2020 | |
| WO | 2020/203519 A1 | 10/2020 | |

OTHER PUBLICATIONS

Written Opinion issued in PCT/JP2020/036190 on Dec. 15, 2020.
International Preliminary Report on Patentability completed by WIPO on Mar. 15, 2022 in connection with International Patent Application No. PCT/JP2020/036190.
Office Action, issued by the China National Intellectual Property Administration on Sep. 15, 2023, in connection with Chinese Patent Application No. 202080066829.5.
Office Action, issued by the China National Intellectual Property Administration on Feb. 2, 2024, in connection with Chinese Patent Application No. 202080066829.5.
Office Action, issued by the China National Intellectual Property Administration on Jun. 28, 2024, in connection with Chinese Patent Application No. 202080066829.5.

* cited by examiner

OPTICALLY ANISOTROPIC LAYER, OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2020/036190 filed on Sep. 25, 2020, which was published under PCT Article 21(2) in Japanese, and which claims priority under 35 U.S.C. § 119 (a) to Japanese Patent Application No. 2019-177734 filed on Sep. 27, 2019. The above applications are hereby expressly incorporated by reference, in their entirety, into the present application.

BACKGROUND OF THE INVENTION

1. Field of the Invention

The present invention relates to an optically anisotropic layer, an optical film, a polarizing plate, and an image display device.

2. Description of the Related Art

Optical films such as an optical compensation sheet and a phase difference film are used in various image display devices in order to eliminate image coloration or expand a viewing angle.

A stretched birefringent film has been used as the optical film, but in recent years, it has been proposed to use an optical film having an optically anisotropic layer consisting of a liquid crystal compound instead of the stretched birefringent film.

As such an optically anisotropic layer, for example, an optically anisotropic layer in which a polymerizable composition including one or more polymerizable rod-shaped liquid crystal compounds exhibiting a smectic phase is immobilized in a state of exhibiting a smectic phase is described in JP2015-200861A ([Claim 1]).

In addition, a phase difference film in which a liquid crystal compound exhibiting a smectic phase is immobilized in the smectic phase and the phase difference film includes a non-liquid crystal compound satisfying a predetermined condition is described in JP2016-051178A ([Claim 1]).

SUMMARY OF THE INVENTION

The present inventors have conducted investigations on the optically anisotropic layer described in JP2015-200861A and the phase difference film described in JP2016-051178A, and have thus found that there is room for improvement in terms of the surface condition and there is also room for improvement in terms of the contrast of an image display device having the optically anisotropic layer or the phase difference film.

Therefore, an object of the present invention is to provide an optically anisotropic layer having an excellent surface condition, with which an image display device having an excellent contrast can be manufactured; and an optical film, a polarizing plate, and an image display device, each having the optically anisotropic layer.

The present inventors have conducted intensive examinations to accomplish the object, and as a result, they have found that by using a polymerizable liquid crystal composition obtained by blending an additive having a molecular length satisfying a predetermined relational expression together with a polymerizable rod-shaped liquid crystal compound exhibiting a liquid crystal state of a smectic phase, the surface condition of an optically anisotropic layer thus formed is good and the contrast of an image display device having the optically anisotropic layer is good, thereby completing the present invention.

That is, the present inventors have found that the object can be accomplished by the following configurations.

[1] An optically anisotropic layer obtained by immobilizing a polymerizable liquid crystal composition including a polymerizable rod-shaped liquid crystal compound exhibiting a liquid crystal state of a smectic phase and an additive in a liquid crystal state of a smectic phase, in which a molecular length A (Å) of the polymerizable rod-shaped liquid crystal compound, a layer interval B (Å) of the smectic phase of the optically anisotropic layer, and a molecular length C (Å) of the additive satisfy a relationship of Expression (1-1), $$0.5 \times B \leq C \leq 0.6 \times A \qquad (1\text{-}1).$$

[2] The optically anisotropic layer as described in [1],
in which the polymerizable liquid crystal composition contains a polymer having a constitutional unit derived from a fluoroaliphatic group-containing monomer represented by Formula (3) which will be described later.

[3] The optically anisotropic layer as described in [1] or [2],
in which the polymerizable rod-shaped liquid crystal compound has reverse wavelength dispersion.

[4] The optically anisotropic layer as described in any one of [1] to [3],
in which the polymerizable rod-shaped liquid crystal compound has any of aromatic rings selected from the group consisting of groups represented by Formulae (Ar-1) to (Ar-7) which will be described later.

[5] The optically anisotropic layer as described in [4],
in which the polymerizable rod-shaped liquid crystal compound is a compound represented by Formula (I) which will be described later.

[6] The optically anisotropic layer as described in [5],
in which an $SP_A$ indicating a value of a solubility parameter of a partial structure represented by $L^1\text{-}SP^1\text{-}D^5\text{-}(A^1)_{a1}\text{-}D^3\text{-}(G^1)_{g1}\text{-}D^1$ in Formula (I) which will be described later and an $SP_C$ indicating a value of a solubility parameter of the additive satisfy a relationship of Expression (2-1), $$|SP_A - SP_C| \leq 1.0 \qquad (2\text{-}1).$$

[7] The optically anisotropic layer as described in [5] or [6],
in which an $SP_A$ indicating a value of a solubility parameter of a partial structure represented by $L^1\text{-}SP^1\text{-}D^5\text{-}(A^1)_{a1}\text{-}D^3\text{-}(G^1)_{g1}\text{-}D^1$ in Formula (I) which will be described later and an $SP_C$ indicating a value of a solubility parameter of the additive satisfy a relationship of Expression (2-2), $$|SP_A - SP_C| \leq 0.3 \qquad (2\text{-}2).$$

[8] The optically anisotropic layer as described in any one of [1] to [7],
in which the additive has a polymerizable group at one terminal of a molecule and an aromatic ring which may have a substituent at the other terminal of the molecule.

[9] The optically anisotropic layer as described in any one of [1] to [8],
in which the polymerizable liquid crystal composition further contains a polyfunctional liquid crystal compound having three or more polymerizable groups.

[10] An optical film comprising the optically anisotropic layer as described in any one of [1] to [9].

[11] A polarizing plate comprising:
the optical film as described in [10]; and
a polarizer.

[12] An image display device comprising the optical film as described in [10] or the polarizing plate as described in [11].

According to the present invention, the present invention can provide an optically anisotropic layer having an excellent surface condition, with which an image display device having an excellent contrast can be manufactured; and an optical film, a polarizing plate, and an image display device, each having the optically anisotropic layer.

DESCRIPTION OF THE PREFERRED EMBODIMENTS

Figure 1:
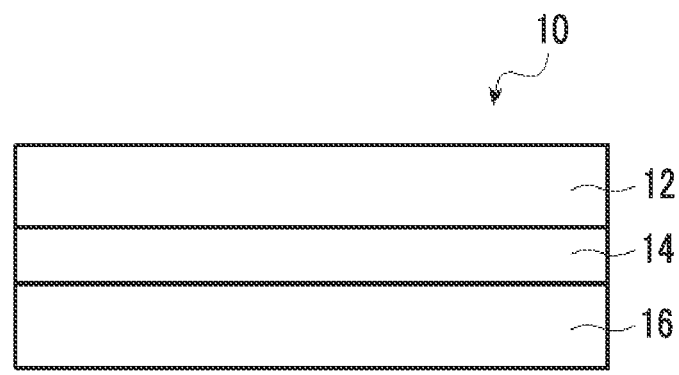
FIG. 1 is a schematic cross-sectional view showing an example of the optical film of an embodiment of the present invention.

Hereinafter, the present invention will be described in detail.

Descriptions on the constitutional requirements which will be described later are made based on representative embodiments of the present invention in some cases, but it should not be construed that the present invention is limited to such embodiments.

Furthermore, in the present specification, a numerical value range expressed using "to" means a range that includes the preceding and succeeding numerical values of "to" as the lower limit value and the upper limit value, respectively.

In addition, in the present specification, only one kind of the substance corresponding to each component may be used alone or two or more kinds thereof may also be used in combination, for each component. Here, in a case where the two or more substances are used in combination for each component, the content of the component refers to a total content of the substances used in combination unless otherwise specified.

In addition, in the present specification, the bonding direction of a divalent group (for example, —CO—NR—) as noted is not particularly limited unless the bonding position is specified, and for example, in a case where $D^1$ in Formula (I) which will be described later is —CO—NR—, $D^1$ may be either *1-CO—NR—*2 or *1-NR—CO—*2, in which *1 represents a bonding position to the $G^1$ side and *2 represents a bonding position to the $Ar^1$ side.

[Optically Anisotropic Layer]

The optically anisotropic layer of an embodiment of the present invention is an optically anisotropic layer obtained by immobilizing a polymerizable liquid crystal composition (hereinafter also formally simply referred to as "the polymerizable liquid crystal composition of the present invention") including a polymerizable rod-shaped liquid crystal compound exhibiting a liquid crystal state of a smectic phase (hereinafter simply referred to as a polymerizable smectic rod-shaped liquid crystal compound) and an additive in a liquid crystal state of a smectic phase.

In addition, in the present invention, a molecular length A (Å) of the polymerizable smectic rod-shaped liquid crystal compound, a layer interval B (Å) of the smectic phase of the optically anisotropic layer, and a molecular length C (Å) of the additive satisfy a relationship of Expression (1-1).

Furthermore, in a case where the polymerizable liquid crystal composition of the present invention contains two or more kinds of polymerizable smectic rod-shaped liquid crystal compounds, Expression (1-1) may be satisfied in relation to at least one polymerizable smectic rod-shaped liquid crystal compound.

$$0.5 \times B \leq C \leq 0.6 \times A \qquad (1\text{-}1)$$

In the present invention, the molecular length A of the polymerizable smectic rod-shaped liquid crystal compound and the molecular length C of the additive refer to values calculated by the following procedure.

(1) Specify the structure of a compound (target compound) to be calculated.
(2) Save a ChemDraw file in which the chemical formula of the target compound is created in a "MDLMolfile format".
(3) Open the saved MDLMolfile format file with a molecular modeling application (for example, Winmostar), and optimize the structure by a simple molecular force field method.
(4) The interatomic distance between both terminals of the target compound after the structural optimization is calculated as a molecular length.

In the present invention, the layer interval B of the smectic phase of the optically anisotropic layer refers to a value calculated by the following method.

That is, the manufactured optically anisotropic layer is subjected to X-ray diffraction measurement with the following devices under the following conditions, and the layer interval of the smectic phase is calculated from an X-ray diffraction pattern derived from a smectic phase order.

<Devices and Conditions>
X-ray diffractometer: X-ray diffractometer for thin film structure evaluation (ATXG, manufactured by Rigaku)
Cu beam source: 50 kV·300 mA
Solar slit: 0.45

In the present invention, by setting the molecular length A (Å) of the polymerizable smectic rod-shaped liquid crystal compound, the layer interval B (Å) of the smectic phase of the optically anisotropic layer, and the molecular length C (Å) of the additive to satisfy the relationship of Expression (1-1), the surface condition of an optically anisotropic layer thus formed is good and the contrast of an image display device having the optically anisotropic layer is good.

A reason therefor is not specifically clear, but is presumed to be as follows by the present inventors.

That is, it is considered that by satisfying the relationship of Expression (1-1), the solubility of the polymerizable smectic rod-shaped liquid crystal compound in the coating liquid is improved and the additive can enter between the molecules of the smectic-aligned polymerizable smectic rod-shaped liquid crystal compounds without disturbing the smectic alignment upon immobilization in the liquid crystal state of the smectic phase, and therefore, the surface condition of an optically anisotropic layer thus formed is good and the contrast of an image display device having the optically anisotropic layer is good.

Hereinafter, the respective components of the polymerizable liquid crystal composition of the present invention will be described in detail.

[Polymerizable Smectic Rod-Shaped Liquid Crystal Compound]

The polymerizable smectic rod-shaped liquid crystal compound contained in the polymerizable liquid crystal composition of the present invention is not particularly limited as long as it is a rod-shaped liquid crystal compound having a polymerizable group and exhibiting a liquid crystal state of a smectic phase.

The polymerizable group contained in the polymerizable smectic rod-shaped liquid crystal compound is not particularly limited, but is preferably a polymerizable group which is radically polymerizable or cationically polymerizable.

A known radically polymerizable group can be used as the radically polymerizable group, and suitable examples thereof include an acryloyloxy group and a methacryloyloxy group. In this case, it is known that the acryloyloxy group generally has a high polymerization rate, and from the viewpoint of improvement of productivity, the acryloyloxy group is preferable but the methacryloyloxy group can also be used as the polymerizable group.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is suitable, and an epoxy group, an oxetanyl group, or the vinyloxy group is particularly preferable.

Particularly preferred examples of the polymerizable groups include a polymerizable group represented by any of Formulae (P-1) to (P-20).

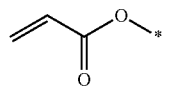
(P-1)

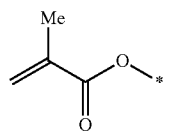
(P-2)

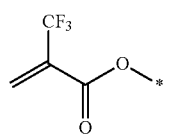
(P-3)

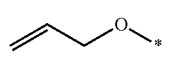
(P-4)

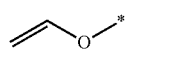
(P-5)

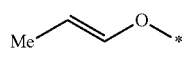
(P-6)

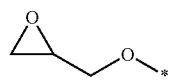
(P-7)

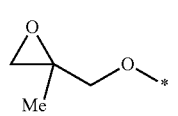
(P-8)

-continued

(P-9)

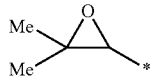
(P-10)

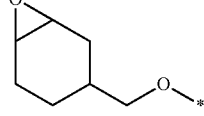
(P-11)

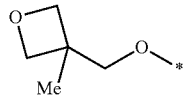
(P-12)

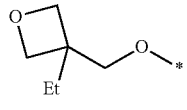
(P-13)

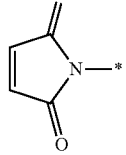
(P-14)

(P-15)

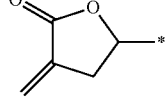
(P-16)

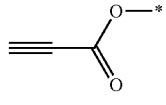
(P-17)

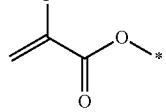
(P-18)

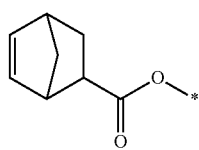
(P-19)

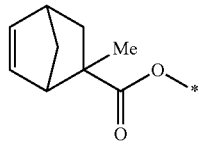
(P-20)

In addition, the liquid crystal state of the smectic phase exhibited by the polymerizable smectic rod-shaped liquid crystal compound is preferably a higher-order smectic phase. The higher-order smectic phase as mentioned herein is a smectic A phase, a smectic B phase, a smectic D phase, a smectic E phase, a smectic F phase, a smectic G phase, a smectic H phase, a smectic I phase, a smectic J phase, a smectic K phase, or a smectic L phase, and among these, the smectic A phase, the smectic B phase, the smectic F phase, the smectic I phase, the slanted smectic F phase, or the slanted smectic I phase is preferable, and the smectic A phase or the smectic B phase is more preferable.

Examples of such polymerizable smectic liquid crystal compounds include those described in paragraphs [0043] to [0055] of JP2013-033249A, those described in paragraphs [0084] to [0091] of JP2017-125009A, and a compound (1-1) to a compound (1-19) represented by the following formulae. Moreover, since a group adjacent to the acryloyloxy group in the structure of the compound (1-14) represents a propylene group (a group obtained by substituting a methyl group with an ethylene group), the compound (1-14) represents a mixture of regioisomers in which the positions of the methyl groups are different.

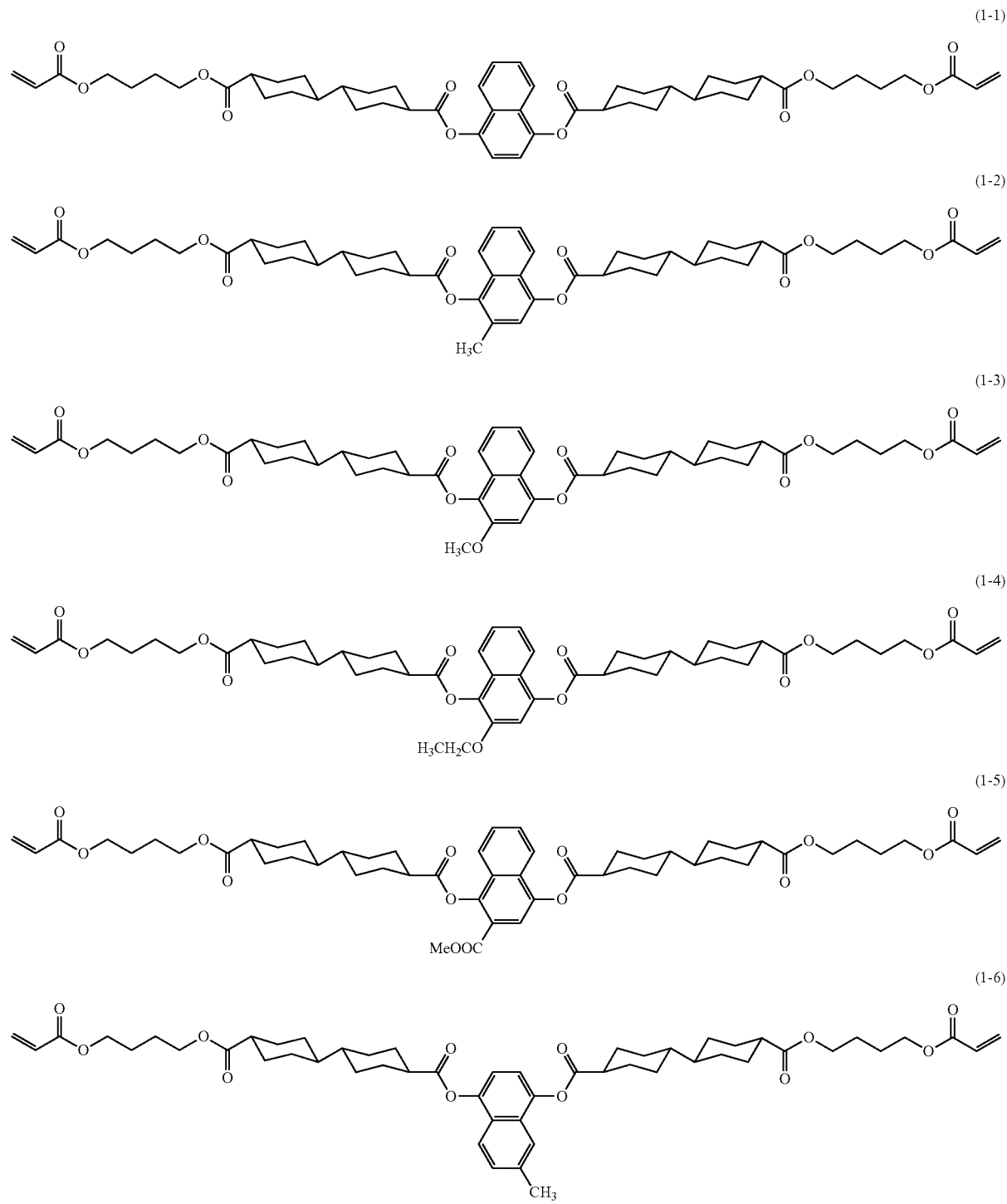

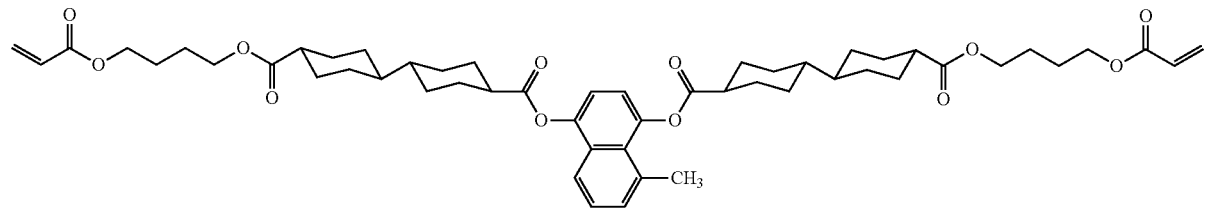
(1-7)
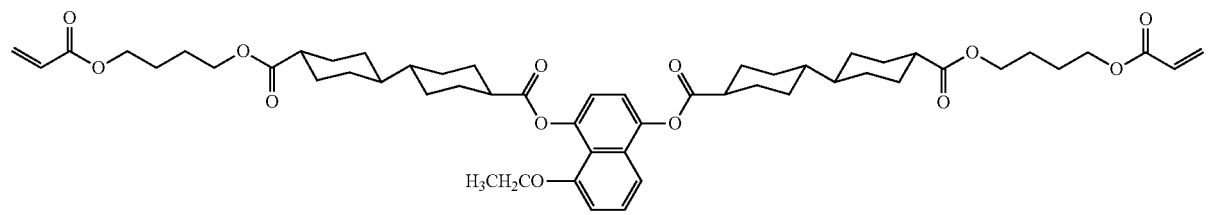
(1-8)
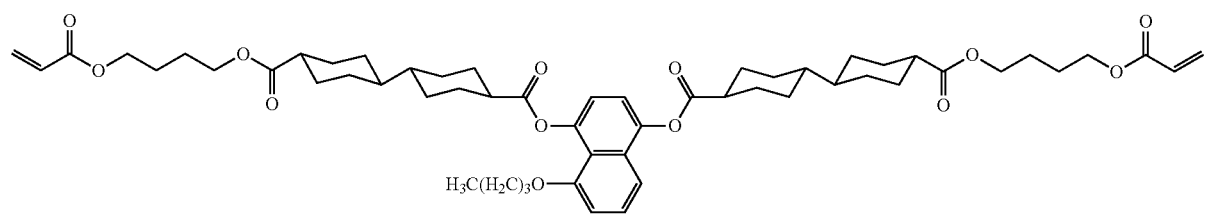
(1-9)
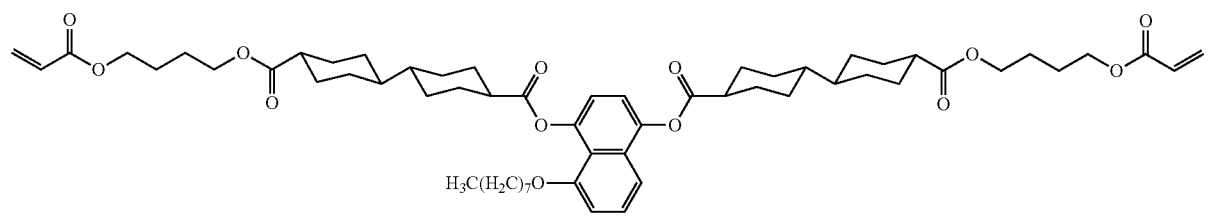
(1-10)
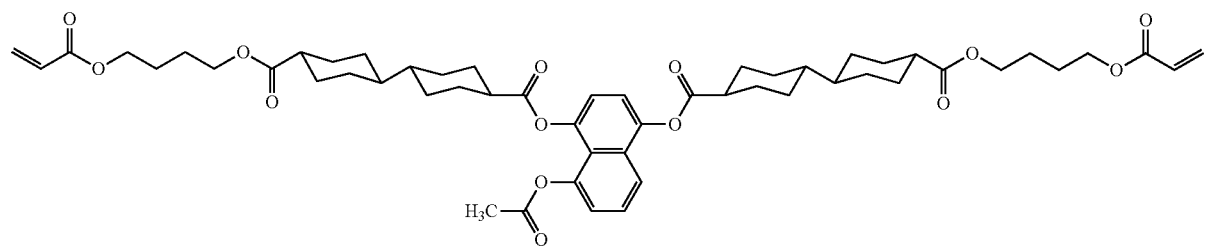
(1-11)
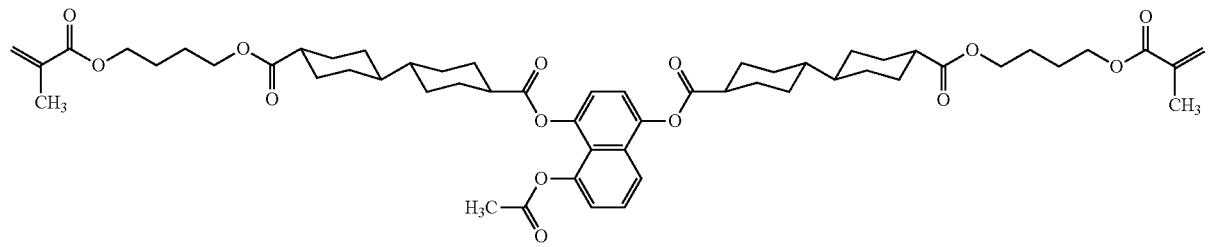
(1-12)

-continued
(1-13)
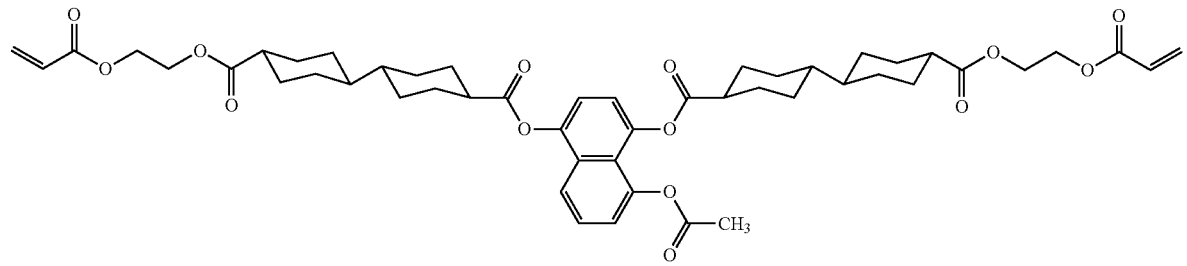
(1-14)
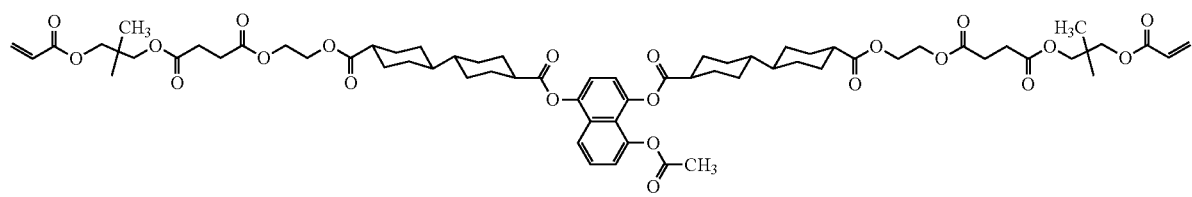
(1-15)
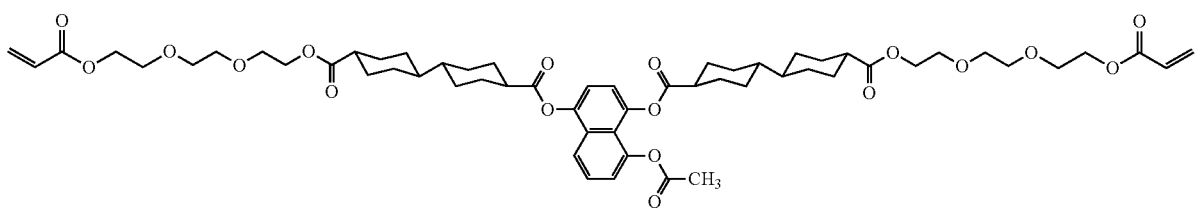
(1-16)
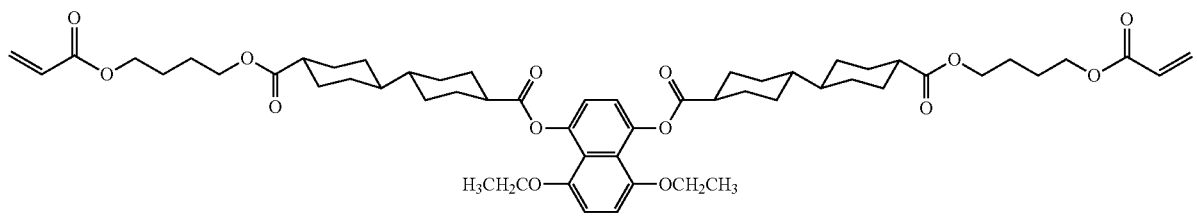
(1-17)
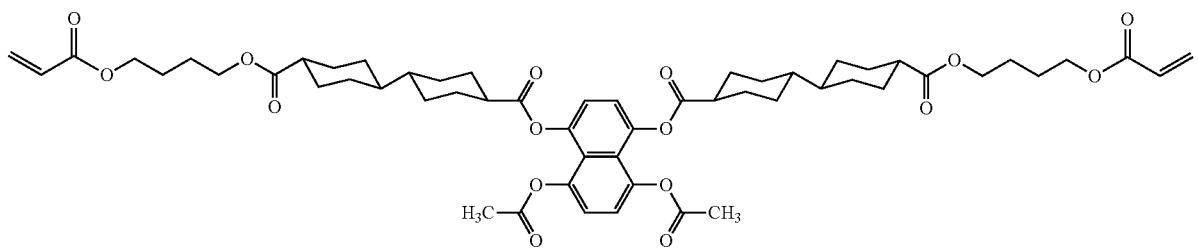
(1-18)
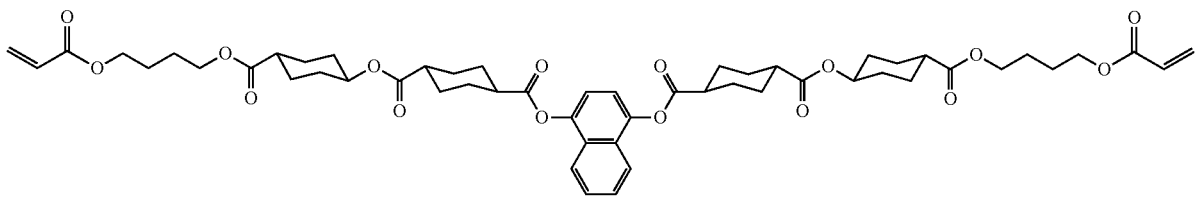

(1-19)

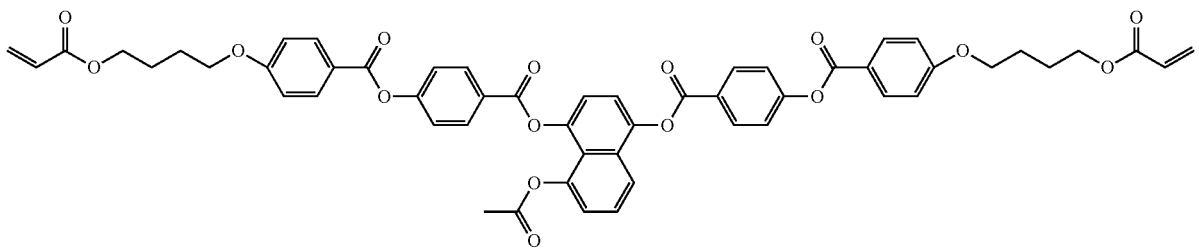

In the present invention, the polymerizable smectic rod-shaped liquid crystal compound is preferably a polymerizable liquid crystal compound having reverse wavelength dispersibility for a reason that the optical compensability is improved.

Here, in the present specification, the "polymerizable liquid crystal compound having reverse wavelength dispersibility" means that in a case where an in-plane retardation (Re) value at a specific wavelength (visible light range) of a phase difference film manufactured using the polymerizable liquid crystal compound is measured, the Re value is equal or higher as a measurement wavelength is increased.

In addition, in the present invention, it is preferable that the polymerizable smectic rod-shaped liquid crystal compound is a polymerizable liquid crystal compound having any of aromatic rings selected from the group consisting of groups represented by Formulae (Ar-1) to (Ar-7) for a reason that the optical compensability is further improved.

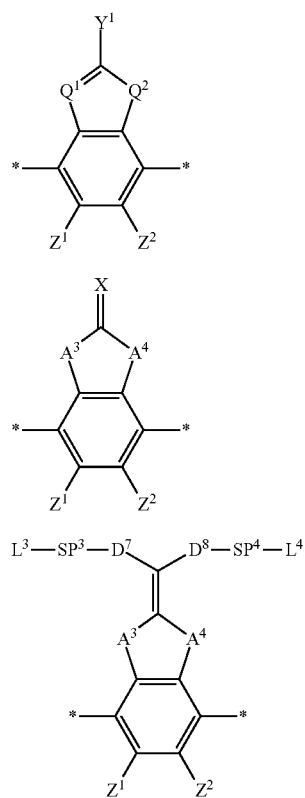

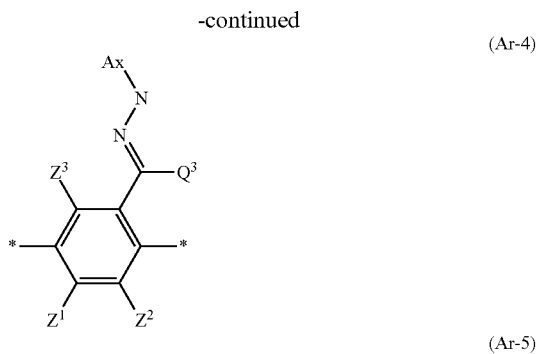

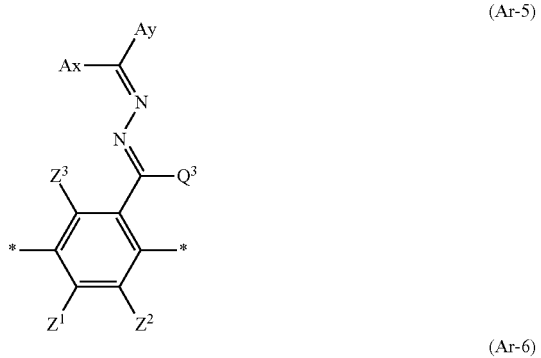

In Formulae (Ar-1) to (Ar-7), * represents a bonding position, that is, a bonding position to a portion other than the aromatic ring included in the polymerizable smectic rod-shaped liquid crystal compound.

In addition, in Formula (Ar-1), $Q^1$ represents N or CH, $Q^2$ represents —S—, —O—, or —N($R^6$)—, $R^6$ represents a hydrogen atom or an alkyl group having 1 to 6 carbon atoms, $Y^1$ represents an aromatic hydrocarbon group having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —$CH_2$—'s constituting the alicyclic hydrocarbon group may be substituted with —O—, —S—, or —NH—.

Here, specific examples of the alkyl group having 1 to 6 carbon atoms, represented by $R^6$, include a methyl group, an ethyl group, a propyl group, an isopropyl group, an n-butyl group, an isobutyl group, a sec-butyl group, a tert-butyl group, an n-pentyl group, and an n-hexyl group.

In addition, examples of the aromatic hydrocarbon group having 6 to 12 carbon atoms, represented by $Y^1$, include aryl groups such as a phenyl group, a 2,6-diethylphenyl group, and a naphthyl group.

Examples of the aromatic heterocyclic group having 3 to 12 carbon atoms, represented by $Y^1$, include heteroaryl groups such as a thienyl group, a thiazolyl group, a furyl group, and a pyridyl group.

Examples of the alicyclic hydrocarbon group having 6 to 20 carbon atoms, represented by $Y^1$, include a cyclohexylene group, a cyclopentylene group, a norbornene group, and an adamantylene group.

Examples of a substituent which may be contained in $Y^1$ include an alkyl group, an alkoxy group, an alkylcarbonyl group, an alkoxycarbonyl group, an alkylcarbonyloxy group, an alkylamino group, a dialkylamino group, an alkylamide group, an alkenyl group, an alkynyl group, a halogen atom, a cyano group, a nitro group, an alkylthiol group, and an N-allylcarbamate group, and among these, the alkyl group, the alkoxy group, the alkoxycarbonyl group, the alkylcarbonyloxy group, or the halogen atom is preferable.

As the alkyl group, a linear, branched, or cyclic alkyl group having 1 to 18 carbon atoms is preferable, an alkyl group having 1 to 8 carbon atoms (for example, a methyl group, an ethyl group, a propyl group, an isopropyl group, an n-butyl group, an isobutyl group, a sec-butyl group, a t-butyl group, and a cyclohexyl group) is more preferable, an alkyl group having 1 to 4 carbon atoms is still more preferable, and the methyl group or the ethyl group is particularly preferable.

As the alkoxy group, an alkoxy group having 1 to 18 carbon atoms is preferable, an alkoxy group having 1 to 8 carbon atoms (for example, a methoxy group, an ethoxy group, an n-butoxy group, and a methoxyethoxy group) is more preferable, an alkoxy group having 1 to 4 carbon atoms is still more preferable, and the methoxy group or the ethoxy group is particularly preferable.

Examples of the alkoxycarbonyl group include a group in which an oxycarbonyl group (—O—CO— group) is bonded to the alkyl group exemplified above, and among these, the alkoxycarbonyl group is preferably a methoxycarbonyl group, an ethoxycarbonyl group, an n-propoxycarbonyl group, or an isopropoxycarbonyl group, and more preferably the methoxycarbonyl group.

Examples of the alkylcarbonyloxy group include a group in which a carbonyloxy group (—CO—O— group) is bonded to the alkyl group exemplified above, and among these, the alkylcarbonyloxy group is preferably a methylcarbonyloxy group, an ethylcarbonyloxy group, an n-propylcarbonyloxy group, or an isopropylcarbonyloxy group, and more preferably the methylcarbonyloxy group.

Examples of the halogen atom include a fluorine atom, a chlorine atom, a bromine atom, and an iodine atom, and among these, the fluorine atom or the chlorine atom is preferable.

In addition, in Formulae (Ar-1) to (Ar-7), $Z^1$, $Z^2$, and $Z^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —$OR^7$, —$NR^8R^9$, —$SR^{10}$, —$COOR^{11}$, or —$COR^{12}$, where $R^7$ to $R^{12}$ each independently represent a hydrogen atom or an alkyl group having 1 to 6 carbon atoms, and $Z^1$ and $Z^2$ may be bonded to each other to form an aromatic ring.

Here, as the monovalent aliphatic hydrocarbon group having 1 to 20 carbon atoms, an alkyl group having 1 to 15 carbon atoms is preferable, an alkyl group having 1 to 8 carbon atoms is more preferable, and specifically a methyl group, an ethyl group, an isopropyl group, a tert-pentyl group (1,1-dimethylpropyl group), a tert-butyl group, or a 1,1-dimethyl-3,3-dimethyl-butyl group is still more preferable, and the methyl group, the ethyl group, or the tert-butyl group is particularly preferable.

Examples of the monovalent alicyclic hydrocarbon group having 3 to 20 carbon atoms include monocyclic saturated hydrocarbon groups such as a cyclopropyl group, a cyclobutyl group, a cyclopentyl group, a cyclohexyl group, a cycloheptyl group, a cyclooctyl group, a cyclodecyl group, a methylcyclohexyl group, and an ethylcyclohexyl group; monocyclic unsaturated hydrocarbon groups such as a cyclobutenyl group, a cyclopentenyl group, a cyclohexenyl group, a cycloheptenyl group, a cyclooctenyl group, a cyclodecenyl group, a cyclopentadienyl group, a cyclohexadienyl group, a cyclooctadienyl group, and a cyclodecadiene; and polycyclic saturated hydrocarbon groups such as a bicyclo[2.2.1]heptyl group, a bicyclo[2.2.2]octyl group, a tricyclo[5.2.1.0$^{2,6}$]decyl group, a tricyclo[3.3.1.1$^{3,7}$]decyl group, a tetracyclo[6.2.1.1$^{3,6}$0$^{2,7}$]dodecyl group, and an adamantyl group.

Specific examples of the monovalent aromatic hydrocarbon group having 6 to 20 carbon atoms include a phenyl group, a 2,6-diethylphenyl group, a naphthyl group, and a biphenyl group, and an aryl group having 6 to 12 carbon atoms (particularly a phenyl group) is preferable.

Specific examples of the monovalent aromatic heterocyclic group having 6 to 20 carbon atoms include a 4-pyridyl group, a 2-furyl group, a 2-thienyl group, a 2-pyrimidinyl group, and a 2-benzothiazolyl group.

Examples of the halogen atom include a fluorine atom, a chlorine atom, a bromine atom, and an iodine atom, and among these, the fluorine atom, the chlorine atom, or the bromine atom is preferable.

On the other hand, specific examples of the alkyl group having 1 to 6 carbon atoms, represented by each of $R^7$ to $R^{10}$, include a methyl group, an ethyl group, a propyl group, an isopropyl group, an n-butyl group, an isobutyl group, a sec-butyl group, a tert-butyl group, an n-pentyl group, and an n-hexyl group.

In addition, as described above, $Z^1$ and $Z^2$ may be bonded to each other to form an aromatic ring, and examples of the structure in a case where $Z^1$ and $Z^2$ in Formula (Ar-1) are bonded to each other form an aromatic ring include a group represented by Formula (Ar-1a). Furthermore, in Formula (Ar-1a), * represents a bonding position, and examples of $Q^1$, $Q^2$, and $Y^1$ include the same ones as those described in Formula (Ar-1).

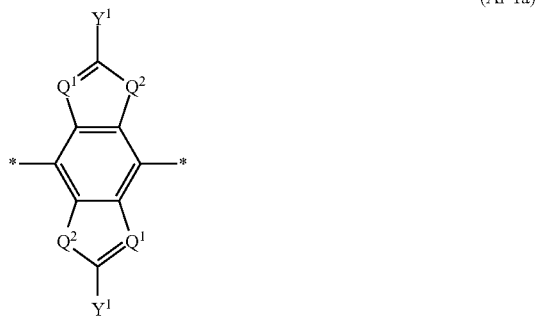

(Ar-1a)

In addition, in Formulae (Ar-2) and (Ar-3), $A^3$ and $A^4$ each independently represent a group selected from the group consisting of —O—, —N($R^{13}$)—, —S—, and —CO—, and $R^3$ represents a hydrogen atom or a substituent.

Examples of the substituent represented by $R^{13}$ include the same ones as the substituents which may be contained in $Y^1$ in Formula (Ar-1).

In addition, in Formula (Ar-2), X represents a hydrogen atom or a non-metal atom of Groups XIV to XVI, to which a substituent may be bonded.

Examples of the non-metal atom of Groups XIV to XVI represented by X include an oxygen atom, a sulfur atom, a nitrogen atom to which a hydrogen atom or a substituent is bonded [=N—$R^{N1}$, $R^{N1}$ represents a hydrogen atom or a substituent], and a carbon atom to which a hydrogen atom or a substituent is bonded [=C—$(R^{C1})_2$, $R^{C1}$ represents a hydrogen atom or a substituent].

Examples of the substituent include an alkyl group, an alkoxy group, an alkyl-substituted alkoxy group, a cyclic alkyl group, an aryl group (for example, a phenyl group and a naphthyl group), a cyano group, an amino group, a nitro group, an alkylcarbonyl group, a sulfo group, and a hydroxyl group.

In addition, in Formula (Ar-3), $D^7$ and $D^8$ each independently represent a single bond; or —CO—, —O—, —S—, —C(=S)—, —$CR^1R^2$—, —$CR^3$=$CR^4$—, —$NR^5$—, or a divalent linking group consisting of a combination of two or more of these groups, where $R^1$ to $R^5$ each independently represent a hydrogen atom, a fluorine atom, or an alkyl group having 1 to 12 carbon atoms.

Here, examples of the divalent linking group represented by one aspect of $D^7$ and $D^8$ include —CO—, —O—, —CO—O—, —C(=S)O—, —$CR^1R^2$—, —$CR^1R^2$—$CR^1R^2$—, —O—$CR^1R^2$—, —$CR^1R^2$—O—$CR^1R^2$—, —CO—O—$CR^1R^2$—, —O—CO—$CR^1R^2$—, —$CR^1R^2$—O—CO—$CR^1R^2$—, —$CR^1R^2$—CO—O—$CR^1R^2$—, —$NR^5$—$CR^1R^2$—, and —CO—$NR^5$—. $R^1$, $R^2$, and $R^5$ each independently represent a hydrogen atom, a fluorine atom, or an alkyl group having 1 to 12 carbon atoms.

Among these, any of —CO—, —O—, and —CO—O— is preferable.

Moreover, in Formula (Ar-3), $SP^3$ and $SP^4$ each independently represent a single bond, a linear or branched alkylene group having 1 to 12 carbon atoms, or a divalent linking group in which one or more of —$CH_2$—'s constituting the linear or branched alkylene group having 1 to 12 carbon atoms are substituted with —O—, —S—, —NH—, —N(Q)-, or —CO—, where Q represents a substituent. Examples of the substituent include the same ones as the substituents which may be contained in $Y^1$ in Formula (Ar-1).

Here, suitable examples of the linear or branched alkylene group having 1 to 12 carbon atoms, represented by one aspect of $SP^3$ and $SP^4$, include a methylene group, an ethylene group, a propylene group, a butylene group, a pentylene group, a hexylene group, a methylhexylene group, and a heptylene group. Incidentally, $SP^1$ and $SP^2$ may be a divalent linking group in which one or more of —$CH_2$—'s constituting the linear or branched alkylene group having 1 to 12 carbon atoms are substituted with —O—, —S—, —NH—, —N(Q)-, or —CO—, as described above, and examples of the substituent represented by Q include the same ones as the substituents which may be contained in $Y^1$ in Formula (Ar-1).

In addition, in Formula (Ar-3), $L^3$ and $L^4$ each independently represent a monovalent organic group, and at least one of $L^3$ or $L^4$ represents a polymerizable group.

Here, examples of the monovalent organic group represented by each of $L^3$ and $L^4$ include an alkyl group, an aryl group, and a heteroaryl group. The alkyl group may be linear, branched, or cyclic, but is preferably linear. The number of carbon atoms of the alkyl group is preferably 1 to 30, more preferably 1 to 20, and still more preferably 1 to 10. Further, the aryl group may be a monocycle or a polycycle, but is preferably the monocycle. The number of carbon atoms of the aryl group is preferably 6 to 25, and more preferably 6 to 10. Further, the heteroaryl group may be a monocycle or a polycycle. The number of heteroatoms constituting the heteroaryl group is preferably 1 to 3. The heteroatoms constituting the heteroaryl group are preferably a nitrogen atom, a sulfur atom, or an oxygen atom. The number of carbon atoms of the heteroaryl group is preferably 6 to 18, and more preferably 6 to 12. In addition, the alkyl group, the aryl group, and the heteroaryl group may be unsubstituted or have a substituent. Examples of the substituent include the same ones as the substituents which may be contained in $Y^1$ in Formula (Ar-1).

In addition, examples of the polymerizable group represented by at least one of $L^3$ or $L^4$ include the same ones as the above-mentioned polymerizable groups which are radically polymerizable or cationically polymerizable, and among these, suitable examples thereof include the above-mentioned polymerizable groups represented by any of Formulae (P-1) to (P-20).

Moreover, in Formulae (Ar-4) to (Ar-7), Ax represents an organic group having 2 to 30 carbon atoms, which has at least one aromatic ring selected from the group consisting of an aromatic hydrocarbon ring and an aromatic heterocyclic ring.

Furthermore, in Formulae (Ar-4) to (Ar-7), Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring.

Here, the aromatic ring in each of Ax and Ay may have a substituent, and Ax and Ay may be bonded to each other to form a ring.

In addition, $Q^3$ represents a hydrogen atom or an alkyl group having 1 to 6 carbon atoms, which may have a substituent.

Examples of each of Ax and Ay include the ones described in paragraphs [0039] to [0095] of WO2014/010325A.

In addition, specific examples of the alkyl group having 1 to 20 carbon atoms, represented by $Q^3$, include a methyl group, an ethyl group, a propyl group, an isopropyl group, an n-butyl group, an isobutyl group, a sec-butyl group, a tert-butyl group, an n-pentyl group, and an n-hexyl group, and examples of the substituent include the same ones as the substituents which may be contained in $Y^1$ in Formula (Ar-1).

In addition, in the present invention, the polymerizable smectic rod-shaped liquid crystal compound is preferably a compound represented by Formula (I) for a reason that the optical compensability is further improved. Furthermore, in Formula (I), Ar represents any of aromatic rings selected from the group consisting of the groups represented by Formulae (Ar-1) to (Ar-7) mentioned above. It should be noted that in a case where q1 in Formula (I) is 2, a plurality of Ar's may be the same as or different from each other.

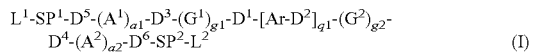
(I)

In Formula (I), a1, a2, g1, and g2 each independently represent 0 or 1. It should be noted that at least one of a1 or g1 represents 1, and at least one of a2 or g2 represents 1.

In addition, in Formula (I), q1 represents 1 or 2.

Moreover, in Formula (I), $D^1$, $D^2$, $D^3$, $D^4$, $D^5$, and $D^6$ each independently represent a single bond; —CO—, —O—, —S—, —C(=S)—, —CR$^1$R$^2$—, —CR$^3$=CR$^4$—, —NR—, or a divalent linking group consisting of a combination of two or more of these groups, and $R^1$ to $R^5$ each independently represent a hydrogen atom, a fluorine atom, or an alkyl group having 1 to 12 carbon atoms. It should be noted that in a case where q1 is 2, a plurality of $D^2$'s may be the same as or different from each other.

In addition, in Formula (I), $G^1$ and $G^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—.

In addition, in Formula (I), $A^1$ and $A^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—.

Furthermore, in Formula (I), $SP^1$ and $SP^2$ each independently represent a single bond, a linear or branched alkylene group having 1 to 12 carbon atoms, or a divalent linking group in which one or more of —CH$_2$—'s constituting the linear or branched alkylene group having 1 to 12 carbon atoms are substituted with —O—, —S—, —NH—, —N(Q)-, or —CO—, where Q represents a substituent.

In addition, in Formula (I), $L^1$ and $L^2$ each independently represent a monovalent organic group, and at least one of $L^1$ or $L^2$ represents a polymerizable group. It should be noted that in a case where Ar is the aromatic ring represented by Formula (Ar-3) mentioned above, at least one of $L^1$ or $L^2$, or $L^3$ or $L^4$ in Formula (Ar-3) represents a polymerizable group.

In Formula (I), it is preferable that any of a1, a2, g1, and g2 is 1 for a reason that the polymerizable liquid crystal composition of the present invention is more likely to exhibit a liquid crystal state of a smectic phase.

In Formula (I), q1 is preferably 1.

In Formula (I), examples of the divalent linking group represented by one aspect of $D^1$, $D^2$, $D^3$, $D^4$, $D^5$, and $D^6$ include the same ones as those described in $D^7$ and $D^8$ in Formula (Ar-3).

Among these, any of —CO—, —O—, and —CO—O— is preferable.

In Formula (I), examples of the aromatic ring having 6 to 20 carbon atoms, represented by one aspect of $G^1$ and $G^2$, include an aromatic hydrocarbon ring such as a benzene ring, a naphthalene ring, an anthracene ring, and a phenanthroline ring; and an aromatic heterocyclic ring such as a furan ring, a pyrrole ring, a thiophene ring, a pyridine ring, a thiazole ring, and a benzothiazole ring, and among these, the benzene ring (for example, a 1,4-phenyl group) is preferable.

In Formula (I), the divalent alicyclic hydrocarbon group having 5 to 20 carbon atoms, represented by one aspect of $G^1$ and $G^2$, is preferably a 5- or 6-membered ring. In addition, the alicyclic hydrocarbon group may be saturated or unsaturated, but is preferably a saturated alicyclic hydrocarbon group. With regard to the divalent alicyclic hydrocarbon group represented by each of $G^1$ and $G^2$, reference can be made to, for example, the description in paragraph [0078] of JP2012-21068A, the contents of which are hereby incorporated by reference.

In the present invention, $G^1$ and $G^2$ in Formula (I) are each preferably a cycloalkane ring.

Specific examples of the cycloalkane ring include a cyclohexane ring, a cyclopeptane ring, a cyclooctane ring, a cyclododecane ring, and a cyclodocosane ring.

Among those, the cyclohexane ring is preferable, a 1,4-cyclohexylene group is more preferable, and a trans-1,4-cyclohexylene group is still more preferable.

Moreover, in Formula (I), examples of the substituent which may be contained in the aromatic ring having 6 to 20 carbon atoms or the divalent alicyclic hydrocarbon group having 5 to 20 carbon atoms in $G^1$ and $G^2$ include the same ones as the substituents which may be contained in $Y^1$ in Formula (Ar-1).

In Formula (I), examples of the aromatic ring having 6 to 20 or more carbon atoms, represented by one aspect of $A^1$ and $A^2$, include the same ones as those described in $G^1$ and $G^2$ in Formula (I).

In addition, in Formula (I), examples of the divalent alicyclic hydrocarbon group having 5 to 20 carbon atoms, represented by one aspect of $A^1$ and $A^2$, include the same ones as those described in $G^1$ and $G^2$ in Formula (I).

Moreover, examples of the substituent which may be contained in the aromatic ring having 6 to 20 carbon atoms or the divalent alicyclic hydrocarbon group having 5 to 20 carbon atoms in $A^1$ and $A^2$ include the same ones as the substituents which may be contained in $Y^1$ in Formula (Ar-1).

In Formula (I), examples of the linear or branched alkylene group having 1 to 12 carbon atoms, represented by one aspect of $SP^1$ and $SP^2$, include the same ones as those described in $SP^3$ and $SP^4$ in Formula (Ar-3).

In Formula (I), examples of the monovalent organic group represented by each of $L^1$ and $L^2$ include the same ones as those described in $L^3$ and $L^4$ in Formula (Ar-3).

In Formula (I), examples of the polymerizable group represented by at least one of $L^1$ or $L^2$ include the same ones as the above-mentioned polymerizable groups which are radically polymerizable or cationically polymerizable, and among these, suitable examples of the polymerizable group include the above-mentioned polymerizable group represented by any of Formulae (P-1) to (P-20).

For a reason that the durability is good, any of $L^1$ and $L^2$ in Formula (I) are preferably a polymerizable group, and more preferably an acryloyloxy group or a methacryloyloxy group in Formula (I).

In the present invention, for a reason that the surface condition of an optically anisotropic layer is better, an $SP_A$ indicating a value of a solubility parameter of the partial structure represented by $L^1\text{-}SP^1\text{-}D^5\text{-}(A^1)_{a1}\text{-}D^3\text{-}(G^1)^{g1}\text{-}D^1$ in Formula (I) and an $SP_C$ indicating a value of a solubility parameter of an additive which will be described later preferably satisfy a relationship of Expression (2-1), and more preferably satisfy a relationship of Expression (2-2).

Furthermore, in a case where the polymerizable liquid crystal composition of the present invention contains two or more kinds of polymerizable smectic rod-shaped liquid crystal compounds, Expression (2-1) may be satisfied in relation to at least one polymerizable smectic rod-shaped liquid crystal compound.

$$|SP_A - SP_C| \leq 1.0 \tag{2-1}$$

$$|SP_A - SP_C| \leq 0.3 \tag{2-2}$$

Here, the solubility parameter is a value represented by a square root of the molecular aggregation energy, which is a value calculated by a method described in R. F. Fedors, Polymer Engineering Science, 14, p 147 to p 154 (1974).

Examples of the compound represented by Formula (I) include the compounds exhibiting a liquid crystal state of a smectic phase among the compounds represented by General Formula (1) described in JP2010-084032A (in particular, the compounds described in paragraph Nos. [0067] to [0073]), the compound represented by General Formula (II) described in JP2016-053709A (in particular, the compounds described in paragraph Nos. [0036] to [0043]), and the compounds represented by General Formula (1) described in JP2016-081035A (in particular, the compounds described in paragraph Nos. [0043] to [0055].

In addition, suitable examples of the compound represented by Formula (I) include the compounds exhibiting a liquid crystal state of a smectic phase among the compounds represented by Formulae (1) to (22), and specifically include compounds having side chain structures shown in Tables 1 to 3 below as K (side chain structure) in Formulae (1) to (22).

Furthermore, in Tables 1 to 3 below, "*" shown in the side chain structure of K represents a bonding position to an aromatic ring.

In addition, in the side chain structures shown in 2-2 in Table 2 below and 3-2 in Table 3 below, a group adjacent to each of the acryloyloxy group and the methacryloyl group represents a propylene group (a group in which a methyl group is substituted with an ethylene group), and represents a mixture of regioisomers in which the positions of the methyl groups are different.

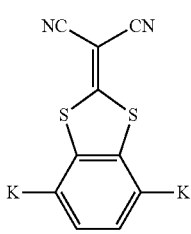

(1)

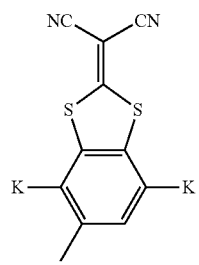

(2)

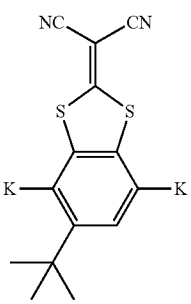

(3)

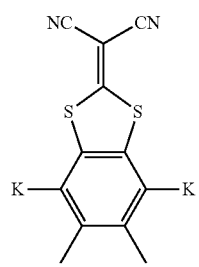

(4)

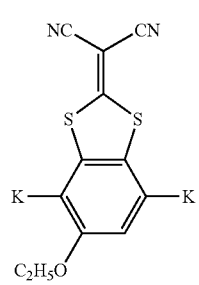

(5)

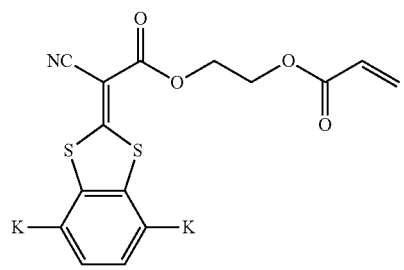

(6)

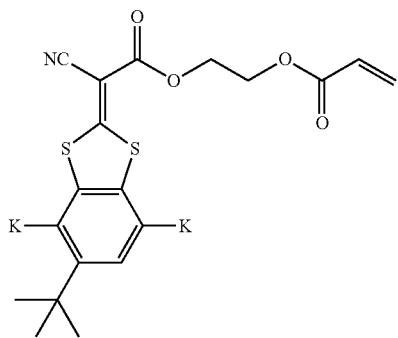

-continued
(16)
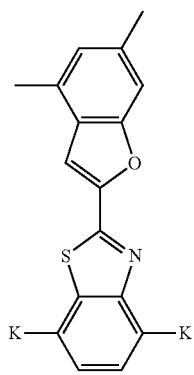
(17)
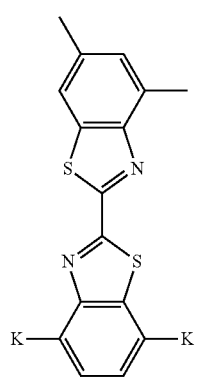
(18)
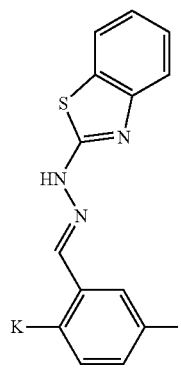
(19)
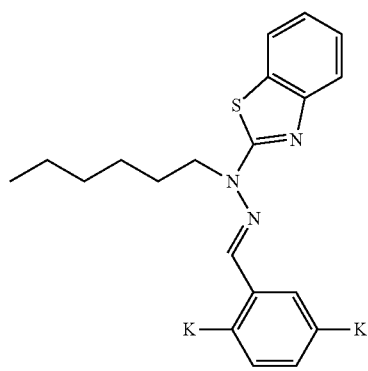
(20)
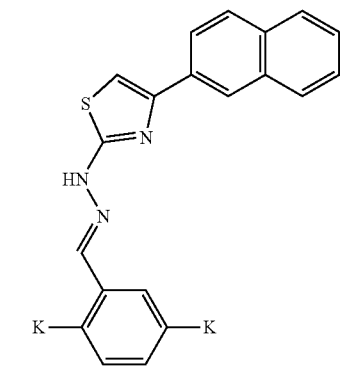
(21)
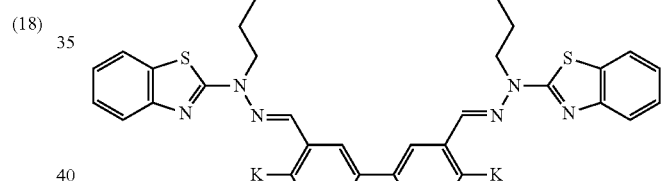
(22)
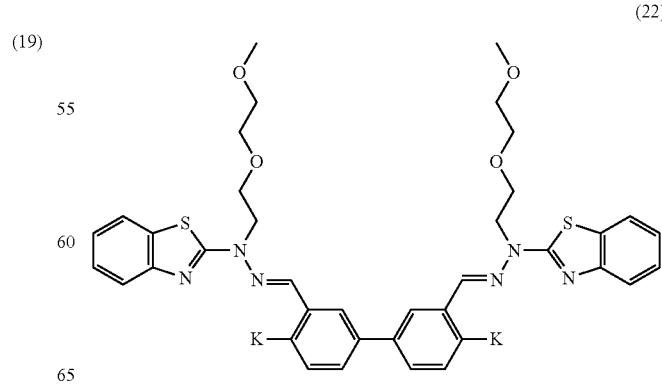

TABLE 1
| | K (side chain structure) |
|---|---|
| 1-1 | 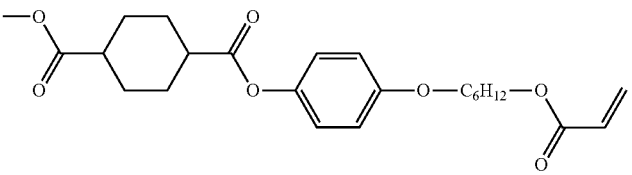 |
| 1-2 | 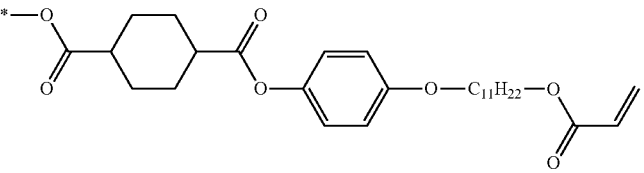 |
| 1-3 | 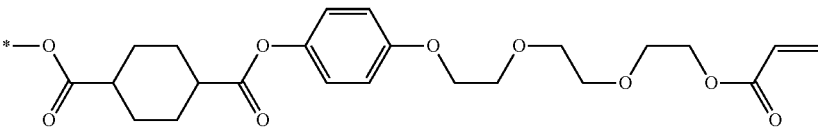 [SMILES: *OC(=O)C1CCC(C(=O)Oc2ccc(OCCOCCOCCOC(=O)C=C)cc2)CC1] |
| 1-4 | 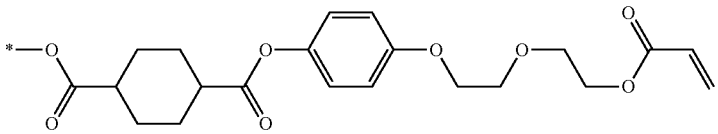 [SMILES: *OC(=O)C1CCC(C(=O)Oc2ccc(OCCOCCOC(=O)C=C)cc2)CC1] |
| 1-5 | 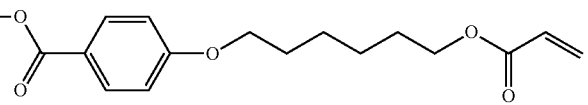 |
| 1-6 | 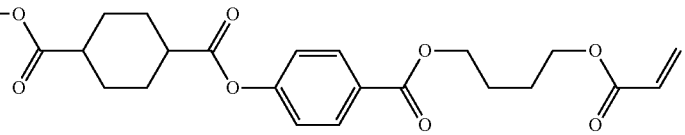 |
TABLE 2
| | K (side chain structure) |
|---|---|
| 2-1 | 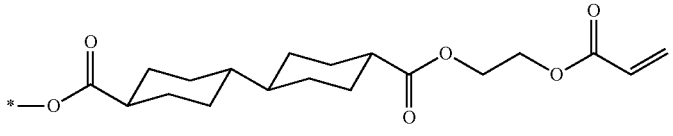 [SMILES: *OC(=O)C1CCC(C2CCC(C(=O)OCCOC(=O)C=C)CC2)CC1] |
| 2-2 | 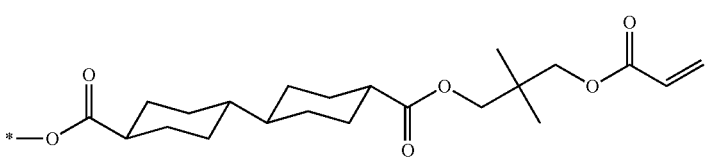 [SMILES: *OC(=O)C1CCC(C2CCC(C(=O)OCC(C)(C)COC(=O)C=C)CC2)CC1] |
| 2-3 | 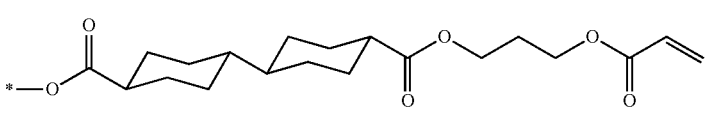 [SMILES: *OC(=O)C1CCC(C2CCC(C(=O)OCCCOC(=O)C=C)CC2)CC1] |

TABLE 2-continued
| | K (side chain structure) |
|---|---|
| 2-4 | 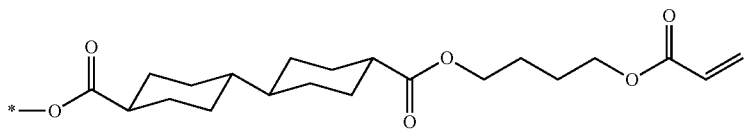 [SMILES: *OC(=O)C1CCC(C2CCC(C(=O)OCCCCOC(=O)C=C)CC2)CC1] |
| 2-5 | 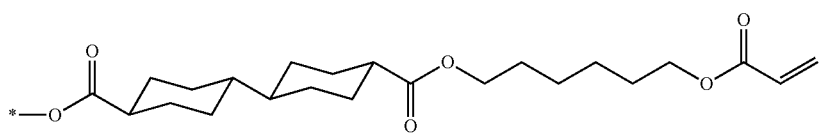 [SMILES: *OC(=O)C1CCC(C2CCC(C(=O)OCCCCCCOC(=O)C=C)CC2)CC1] |
| 2-6 | 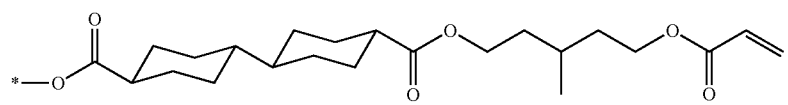 |
| 2-7 | 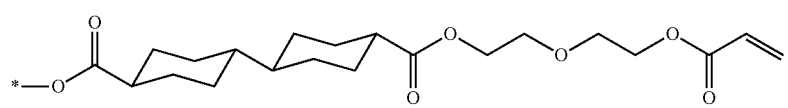 [SMILES: *OC(=O)C1CCC(C2CCC(C(=O)OCCC(C)CCOC(=O)C=C)CC2)CC1] |
| 2-8 | 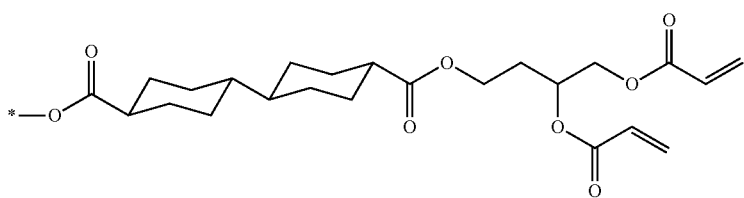 [SMILES: *OC(=O)C1CCC(C2CCC(C(=O)OCCC(COC(=O)C=C)OC(=O)C=C)CC2)CC1] |
| 2-9 | 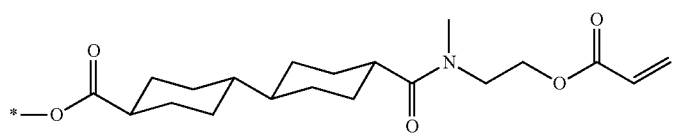 [SMILES: *OC(=O)C1CCC(C2CCC(C(=O)N(C)CCOC(=O)C=C)CC2)CC1] |
| 2-10 | 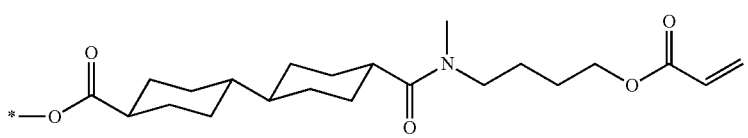 [SMILES: *OC(=O)C1CCC(C2CCC(C(=O)N(C)CCCCOC(=O)C=C)CC2)CC1] |
| 2-11 | 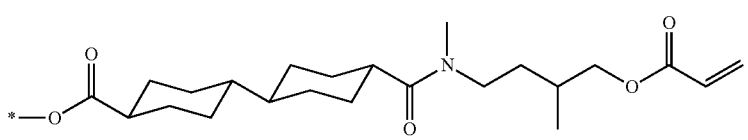 [SMILES: *OC(=O)C1CCC(C2CCC(C(=O)N(C)CCC(C)COC(=O)C=C)CC2)CC1] |
| 2-12 | 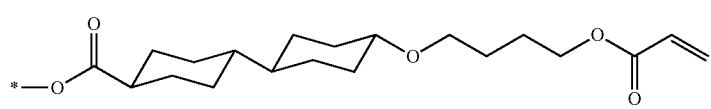 [SMILES: *OC(=O)C1CCC(C2CCC(OCCCCOC(=O)C=C)CC2)CC1] |
| 2-13 | 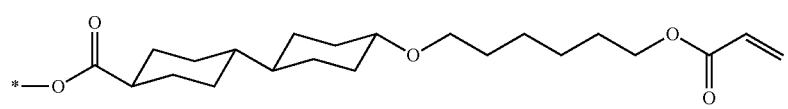 [SMILES: *OC(=O)C1CCC(C2CCC(OCCCCCCOC(=O)C=C)CC2)CC1] |
| 2-14 |  |

TABLE 3
| | K (side chain structure) |
|---|---|
| 3-1 | 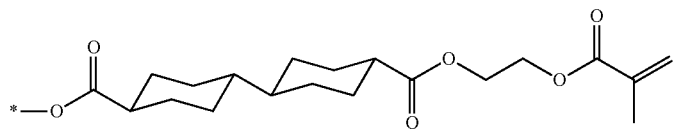 [SMILES: *OC(=O)C1CCC(C2CCC(C(=O)OCCOC(=O)C(=C)C)CC2)CC1] |
| 3-2 | 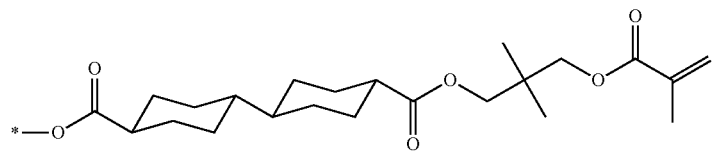 [SMILES: *OC(=O)C1CCC(C2CCC(C(=O)OCC(C)(C)COC(=O)C(=C)C)CC2)CC1] |
| 3-3 | 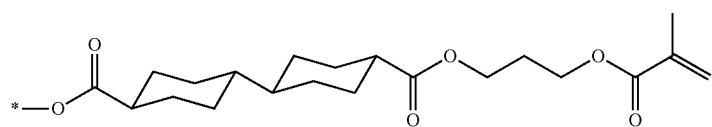 [SMILES: *OC(=O)C1CCC(C2CCC(C(=O)OCCCOC(=O)C(=C)C)CC2)CC1] |
| 3-4 | 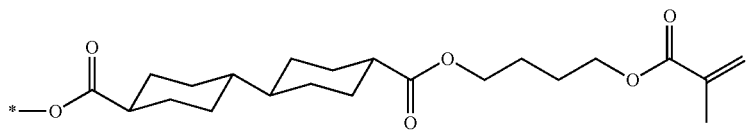 [SMILES: *OC(=O)C1CCC(C2CCC(C(=O)OCCCCOC(=O)C(=C)C)CC2)CC1] |
| 3-5 | 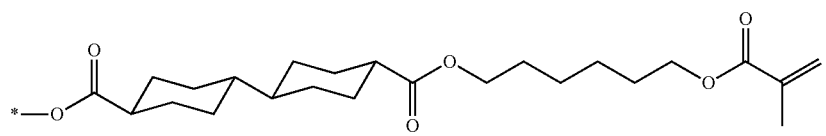 [SMILES: *OC(=O)C1CCC(C2CCC(C(=O)OCCCCCCOC(=O)C(=C)C)CC2)CC1] |
| 3-6 | 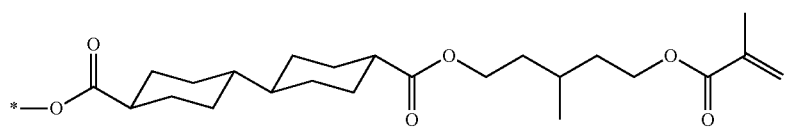 [SMILES: *OC(=O)C1CCC(C2CCC(C(=O)OCCC(C)CCOC(=O)C(=C)C)CC2)CC1] |
| 3-7 | 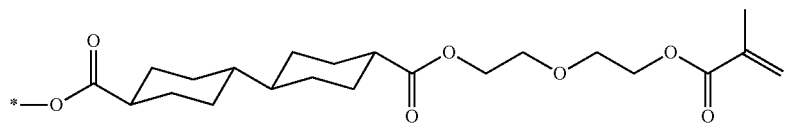 [SMILES: *OC(=O)C1CCC(C2CCC(C(=O)OCCOCCOC(=O)C(=C)C)CC2)CC1] |
| 3-8 | 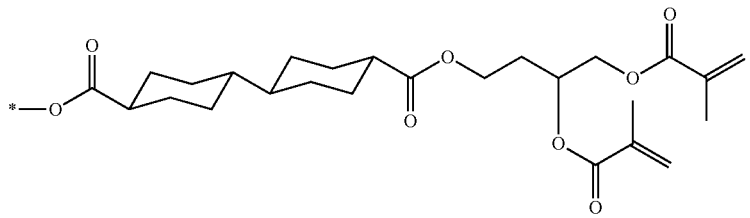 [SMILES: *OC(=O)C1CCC(C2CCC(C(=O)OCCC(COC(=O)C(=C)C)OC(=O)C(=C)C)CC2)CC1] |
| 3-9 | 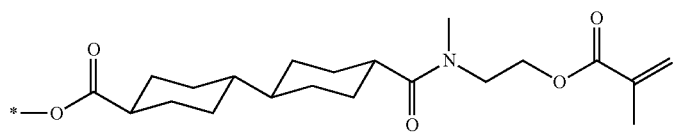 [SMILES: *OC(=O)C1CCC(C2CCC(C(=O)N(C)CCOC(=O)C(=C)C)CC2)CC1] |
| 3-10 | 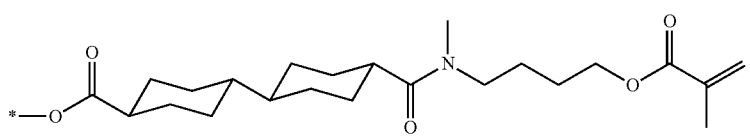 [SMILES: *OC(=O)C1CCC(C2CCC(C(=O)N(C)CCCCOC(=O)C(=C)C)CC2)CC1] |

TABLE 3-continued

K (side chain structure)

3-11

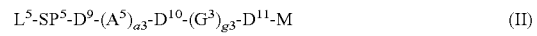

3-12

3-13

3-14

[Additive]

The additive contained in the polymerizable liquid crystal composition of the present invention is not particularly limited as long as it satisfies the relationship of Expression (1-1) and Expression (2-1) mentioned above.

In the present invention, for a reason that the surface condition of an optically anisotropic layer is better, the additive is preferably a compound having a polymerizable group at one terminal of the molecule and having an aromatic ring which may have a substituent at the other terminal of the molecule, and more preferably a compound having a polymerizable group at one terminal of the molecule and having an aromatic ring which is not substituted at the other terminal of the molecule.

Here, examples of the polymerizable group contained at one terminal of the molecule of the additive include the same ones as the polymerizable groups which are radically polymerizable or cationically polymerizable, described in the above-mentioned polymerizable smectic rod-shaped liquid crystal compound, and among these, suitable examples thereof include the polymerizable group represented by any of Formulae (P-1) to (P-20) mentioned above.

In addition, examples of the aromatic ring contained at the other terminal of the molecule of the additive include aromatic rings having 6 to 20 carbon atoms, and specifically include aromatic hydrocarbon rings such as a benzene ring, a naphthalene ring, an anthracene ring, and a phenanthroline ring; and aromatic heterocyclic rings such as a furan ring, a thiophene ring, a pyrrole ring, an oxazole ring, an isoxazole ring, an oxadiazole ring, a thiazole ring, an isothiazole ring, a thiadiazole ring, an imidazole ring, a pyrazole ring, a triazole ring, a furazan ring, a tetrazole ring, a pyridine ring, a pyridazine ring, a pyrimidine ring, a pyrazine ring, a triazine ring, a tetrazine ring, and a benzothiazole ring, and among these, the benzene ring (for example, a 1,4-phenyl group) is preferable.

Incidentally, examples of the substituent which may be contained in the aromatic ring include the same ones as the substituents which may be contained in $Y^1$ in Formula (Ar-1) described in the above-mentioned polymerizable smectic rod-shaped liquid crystal compound.

In the present invention, it is preferable that the additive is a compound represented by Formula (II) for a reason that the surface condition of an optically anisotropic layer is better.

$$L^5\text{-}SP^5\text{-}D^9\text{-}(A^5)_{a3}\text{-}D^{10}\text{-}(G^3)_{g3}\text{-}D^{11}\text{-}M \qquad (II)$$

In Formula (II), a3 and g3 each independently represent an integer of 0 to 2. It should be noted that a3 and g3 represent integers of 1 to 3 in total.

In addition, in Formula (II), $D^9$, $D^{10}$, and $D^{11}$ each independently represent a single bond; or —CO—, —O—, —S—, —C(=S)—, —CR$^1$R$^2$—, —CR$^3$=CR$^4$—, —NR$^5$—, or a divalent linking group consisting of a combination of two or more of these groups, where $R^1$ to $R^3$ each independently represent a hydrogen atom, a fluorine atom, or an alkyl group having 1 to 12 carbon atoms.

In addition, in Formula (II), $G^3$ represents an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—. It should be noted that in a case where g3 is 2, a plurality of $G^3$'s may be the same as or different from each other.

In addition, in Formula (II), $A^5$ represents an aromatic ring having 6 to 20 carbon atoms, which may have a substituent, or a divalent alicyclic hydrocarbon group having 5 to 20 carbon atoms, which may have a substituent, and one or more of —CH$_2$—'s constituting the alicyclic hydrocarbon group may be substituted with —O—, —S—, or —NH—. It should be noted that in a case where a3 is 2, a plurality of $A^5$'s may be the same as or different from each other.

In addition, in Formula (II), $SP^5$ represents a single bond, a linear or branched alkylene group having 1 to 12 carbon atoms, or a divalent linking group in which one or more of —CH$_2$—'s constituting the linear or branched alkylene group having 1 to 12 carbon atoms are substituted with —O—, —S—, —NH—, —N(Q)-, or —CO—, where Q represents a substituent.

Furthermore, in Formula (II), $L^5$ represents a polymerizable group.

Incidentally, in Formula (II), M represents an aromatic ring which may have a substituent.

In Formula (II), it is preferable that either of a3 and g3 is 1 for a reason that the polymerizable liquid crystal composition of the present invention is more likely to exhibit a liquid crystal state of a smectic phase.

In Formula (II), examples of the divalent linking group represented by one aspect of $D^9$, $D^{10}$, and $D^{11}$ include the same ones as those exemplified as the divalent linking group represented by one aspect of $D^1$ and the like in Formula (I), and among these, any of —CO—, —O—, and —CO—O— is preferable.

In Formula (II), examples of the aromatic ring having 6 to 20 carbon atoms, represented by one aspect of $G^3$, include the same ones of those exemplified as the aromatic ring having 6 to 20 carbon atoms, represented by one aspect of $G^1$ and the like in Formula (I), and among these, a benzene ring (for example, a 1,4-phenyl group) is preferable.

In Formula (II), examples of the divalent alicyclic hydrocarbon group having 5 to 20 carbon atoms, represented by one aspect of $G^3$, include the same ones as those exemplified as the divalent alicyclic hydrocarbon group having 5 to 20 carbon atoms, represented by one aspect of $G^1$ and the like in Formula (I), and among these, a cycloalkane ring is preferable, a cyclohexane ring is more preferable, a 1,4-cyclohexylene group is still more preferable, and a trans-1,4-cyclohexylene group is particularly preferable.

Moreover, in $G^3$ in Formula (II), examples of the substituent which may be contained in the aromatic ring having 6 to 20 carbon atoms or the divalent alicyclic hydrocarbon group having 5 to 20 carbon atoms include the same ones as the substituents which may be contained in $Y^1$ in Formula (Ar-1).

In Formula (II), examples of the aromatic ring having 6 to 20 or more carbon atoms, represented by one aspect of $A^5$, include the same ones as those described in $G^1$ and $G^2$ in Formula (I).

In addition, in Formula (II), examples of the divalent alicyclic hydrocarbon group having 5 to 20 carbon atoms, represented by one aspect of $A^5$, include the same ones as those described in $G^1$ and $G^2$ in Formula (I).

Moreover, in $A^5$, examples of the substituent which may be contained in the aromatic ring having 6 to 20 carbon atoms or the divalent alicyclic hydrocarbon group having 5 to 20 carbon atoms include the same ones as the substituents which may be contained in $Y^1$ in Formula (Ar-1).

In Formula (II), examples of the linear or branched alkylene group having 1 to 12 carbon atoms, represented by one aspect of $SP^5$, include the same ones as those exemplified as the linear or branched alkylene group having 1 to 12 carbon atoms, represented by one aspect of $SP^1$ and the like in Formula (I).

In Formula (II), examples of the polymerizable group represented by $L^5$ include the same ones as the polymerizable groups which are radically polymerizable or cationically polymerizable, described in the above-mentioned polymerizable smectic rod-shaped liquid crystal compound, and among these, suitable examples thereof include the polymerizable group represented by any of Formulae (P-1) to (P-20).

In Formula (II), examples of the aromatic ring represented by M include an aromatic ring having 6 to 20 carbon atoms, and specifically include the same ones as those exemplified as the aromatic ring having 6 to 20 carbon atoms, represented by one aspect of $G^1$ and the like in Formula (I), and among these, a benzene ring (for example, a 1,4-phenyl group) is preferable.

Incidentally, in M, examples of the substituent which may be contained in the aromatic ring include the same ones as the substituent which may be contained in $Y^1$ in Formula (Ar-1).

Specific examples of the compound represented by Formula (II) include compounds represented by Formulae (TN-1) to (TN-21)

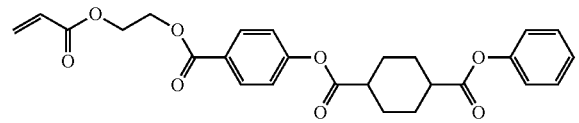
(TN-1)

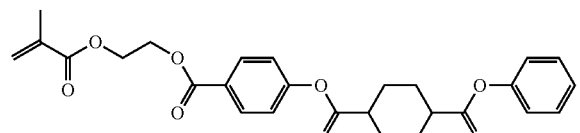
(TN-2)

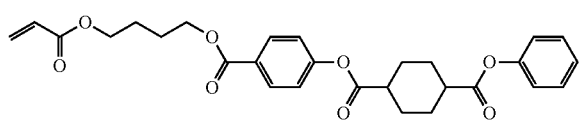
(TN-3)

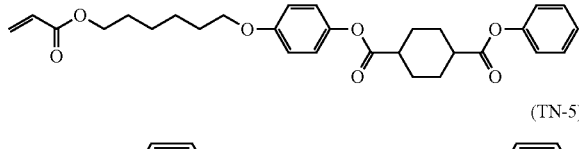
(TN-4)

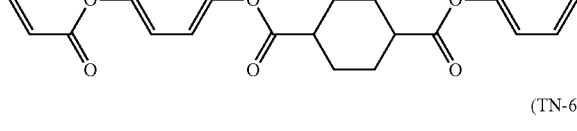
(TN-5)

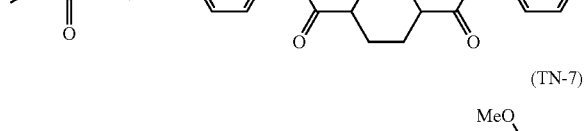
(TN-6)

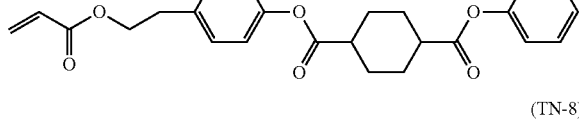
(TN-7)

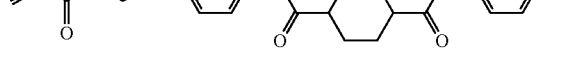
(TN-8)

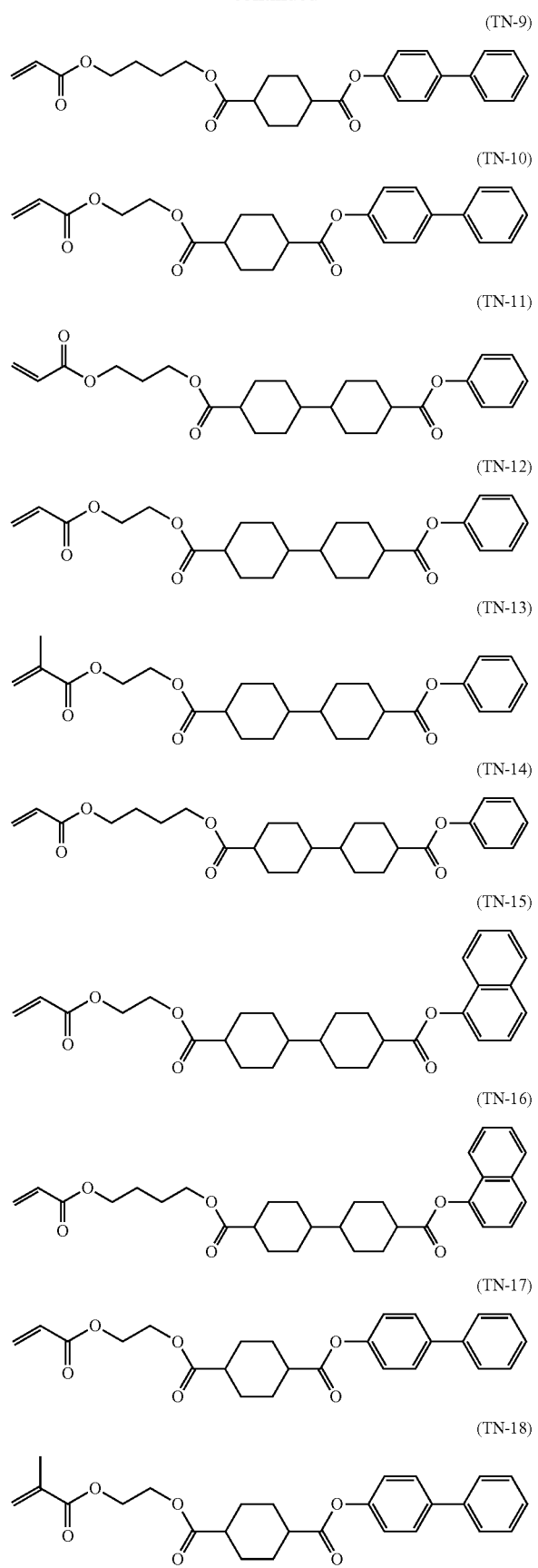

(TN-9)
(TN-10)
(TN-11)
(TN-12)
(TN-13)
(TN-14)
(TN-15)
(TN-16)
(TN-17)
(TN-18)

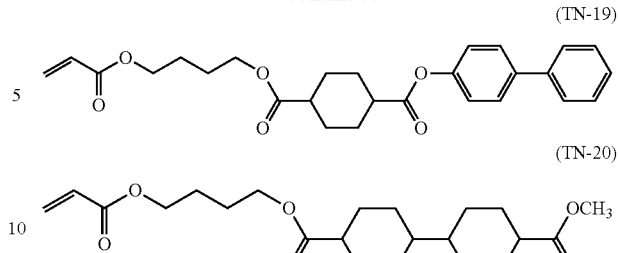

(TN-19)
(TN-20)
(TN-21)

In the present invention, for a reason that the surface condition of an optically anisotropic layer is better and the contrast of an image display device is better, a content of the additive is preferably 1 to 100 parts by mass, and more preferably 5 to 50 parts by mass with respect to 100 parts by mass of the polymerizable smectic rod-shaped liquid crystal compound.

[Polymer]

It is preferable that the polymerizable liquid crystal composition of the present invention contains a polymer having a constitutional unit (repeating unit) derived from a fluoroaliphatic group-containing monomer represented by Formula (3) for a reason that the surface condition of an optically anisotropic layer is better and the contrast of an image display device is better.

Incidentally, the polymer may be a copolymer having two or more constitutional units derived from a fluoroaliphatic group-containing monomer represented by Formula (3), and may also be a copolymer having constitutional units derived from other monomers.

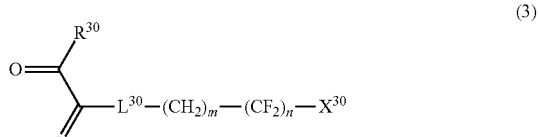

(3)

In Formula (3), $R^{30}$ represents a hydrogen atom or a methyl group, and preferably represents the hydrogen atom.

In addition, in Formula (3), $X^{30}$ represents a hydrogen atom or a fluorine atom.

In Formula (3), $L^{30}$ represents —O— or —NR—, and preferably represents —O—.

Here, $R^{31}$ represents a hydrogen atom or an alkyl group having 1 to 6 carbon atoms.

Specific examples of the alkyl group having 1 to 6 carbon atoms include a methyl group, an ethyl group, a propyl group, an isopropyl group, an n-butyl group, an isobutyl group, a sec-butyl group, a tert-butyl group, an n-pentyl group, and an n-hexyl group.

In Formula (3), m represents an integer of 1 to 6, and n represents an integer of 1 to 18.

m is preferably an integer of 1 to 3, and more preferably 1 or 2. In particular, in a case where $X^{30}$ is a hydrogen atom, m is preferably 1, and in a case where $X^{30}$ is a fluorine atom, m is preferably 2.

n is preferably an integer of 4 to 12, more preferably an integer of 6 to 8, and still more preferably 6.

Examples of the fluoroaliphatic group-containing monomer represented by Formula (3) include those described in paragraphs [0018] to [0021] of JP2013-071945A.

In the present invention, a content of the polymer in a case where the polymer is contained is preferably 0.01 to 10 parts by mass, and more preferably 0.1 to 3 parts by mass with respect to 100 parts by mass of the polymerizable smectic rod-shaped liquid crystal compound.

[Polyfunctional Liquid Crystal Compound]

It is preferable that the polymerizable liquid crystal composition of the present invention contains a polyfunctional liquid crystal compound having three or more polymerizable groups, in addition to the above-mentioned polymerizable smectic rod-shaped liquid crystal compound, for a reason that the surface condition of an optically anisotropic layer is better.

Here, examples of the polymerizable group contained in the polyfunctional liquid crystal compound include the same ones as the polymerizable groups which are radically polymerizable or cationically polymerizable, described in the above-mentioned polymerizable smectic rod-shaped liquid crystal compound, and among these, the polymerizable group represented by any of Formulae (P-1) to (P-20) are preferable.

In addition, the skeleton of the polyfunctional liquid crystal compound is not particularly limited as long as it exhibits liquid crystallinity, but preferably includes a structure represented by the following (MG-I).

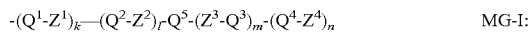
$-(Q^1-Z^1)_k-(Q^2-Z^2)_l-Q^5-(Z^3-Q^3)_m-(Q^4-Z^4)_n$   MG-I:

In the formula, $Q^1$, $Q^2$, $Q^3$, $Q^4$, and $Q^5$ are each independently a 1,4-phenylene group (hereinafter also referred to as a "benzene ring"), a heterocyclic group in which one or two or more CH groups of the 1,4-phenylene group are substituted with N, a 1,4-cyclohexylene group (hereinafter also referred to as a "cyclohexane ring"), a heterocyclic group in which one $CH_2$ group or two $CH_2$ groups not adjacent to each other of the 1,4-cyclohexylene group may be substituted with O and/or S, a 1,4-cyclohexenylene group, or a naphthalene-2,6-diyl group. These groups may each have a substituent. Among those, it is preferable that $Q^5$ is the cyclohexane ring, and $Q^1$, $Q^2$, $Q^3$, and $Q^4$ are each independently the benzene ring or the cyclohexane ring from the viewpoint of cost and the like.

In addition, in the formula, $Z^1$, $Z^2$, $Z^3$, and $Z^4$ are each independently —COO—, —OCO—, —COOCH$_2$CH$_2$—, —CH$_2$CH$_2$OCO—, —CH$_2$CH$_2$—, —OCH$_2$—, —CH$_2$O—, —CH═CH—, —C≡C—, —CH═CH—COO—, —OCO—CH═CH—, —NH═CH$_2$—, —CH$_2$═NH—, —SCO—, —OCS—, or a single bond. Among those, —COO—, —OCO—, —COOCH$_2$CH$_2$—, or —CH$_2$CH$_2$OCO— is preferable from the viewpoint of cost and the like.

In addition, in the formula, k, l, m and n are each independently an integer of 0 to 2, and a total of k, l, m, and n is preferably an integer of 2 to 4, and more preferably 4.

Incidentally, the polyfunctional liquid crystal compound may have two or more structures represented by (MG-I) in one molecule.

Examples of the polyfunctional liquid crystal compounds include the compound represented by Formula (M3) described in paragraph [0033] of JP2014-077068A, and more specifically include the specific examples described in paragraphs [0053] to [0055] of the same publication.

In addition, other examples of the polyfunctional liquid crystal compound include compounds 8, 29, 59 to 61, 64, 65, and 69 among the compounds described in paragraphs [0027] to [0033] of JP2016-053149A.

In the present invention, in a case where the polyfunctional liquid crystal compound is contained, a content of the polyfunctional liquid crystal compound is preferably 1 to 100 parts by mass, and more preferably 5 to 50 parts by mass with respect to 100 parts by mass of the polymerizable smectic rod-shaped liquid crystal compound.

[Other Liquid Crystal Compounds]

The polymerizable liquid crystal composition of the present invention may contain other liquid crystal compounds, in addition to the above-mentioned polymerizable smectic rod-shaped liquid crystal compound and polyfunctional liquid crystal compound.

Examples of such other liquid crystal compounds include a rod-shaped liquid crystal compound having two polymerizable groups and exhibiting a liquid crystal state of a nematic phase, and specifically include the compounds exhibiting a liquid crystal state of a smectic phase among those exemplified as the compound represented by Formula (I), described in the above-mentioned polymerizable smectic rod-shaped liquid crystal compound.

In the present invention, in a case where other liquid crystal compounds are contained, a content of such other liquid crystal compounds is preferably 300 parts by mass or less, and preferably 20 to 200 parts by mass with respect to 100 parts by mass of the polymerizable smectic rod-shaped liquid crystal compound.

[Polymerization Initiator]

The polymerizable liquid crystal composition of the present invention preferably contains a polymerization initiator.

The polymerization initiator to be used is preferably a photopolymerization initiator capable of initiating a polymerization reaction upon irradiation with ultraviolet rays.

Examples of the photopolymerization initiator include α-carbonyl compounds (described in each of the specifications of U.S. Pat. Nos. 2,367,661A and 2,367,670A), acyloin ethers (described in the specification of U.S. Pat. No. 2,448,828A), α-hydrocarbon-substituted aromatic acyloin compounds (described in the specification of U.S. Pat. No. 2,722,512A), multinuclear quinone compounds (described in each of the specifications of U.S. Pat. Nos. 3,046,127A and 2,951,758A), combinations of a triarylimidazole dimer and a p-aminophenyl ketone (described in the specification of U.S. Pat. No. 3,549,367A), acridine and phenazine compounds (described in JP1985-105667A (JP-S60-105667A) and the specification of U.S. Pat. No. 4,239,850A), oxadiazole compounds (described in the specification of U.S. Pat. No. 4,212,970A), and acyl phosphine oxide compounds (described in JP1988-40799B (JP-S63-40799B), JP1993-29234B (JP-H05-29234B), JP1998-95788A (JP-H10-95788A), and JP1998-29997A (JP-H10-29997A)).

In addition, in the present invention, it is also preferable that the polymerization initiator is an oxime-type polymerization initiator, and specific examples of the polymerization initiator include the initiators described in paragraphs [0049] to [0052] of WO2017/170443A.

[Solvent]

It is preferable that the polymerizable liquid crystal composition of the present invention contains a solvent from the viewpoints of the workability for forming an optically anisotropic layer of the embodiment of the present invention, and the like.

Specific examples of the solvent include ketones (for example, acetone, 2-butanone, methyl isobutyl ketone, cyclohexanone, and cyclopentanone), ethers (for example, dioxane and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), cellosolves (for example, methyl cellosolve and ethyl cellosolve), cellosolve acetates, sulfoxides (for example, dimethyl sulfoxide), and amides (for example, dimethylformamide and dimethylacetamide), and these may be used singly or in combination of two or more kinds thereof.

[Leveling Agent]

It is preferable that the polymerizable liquid crystal composition of the present invention contains a leveling agent from the viewpoint that a surface of the optically anisotropic layer of the embodiment of the present invention is maintained smooth and the alignment is easily controlled.

Such a leveling agent is preferably a fluorine-based leveling agent or a silicon-based leveling agent for a reason that it has a high leveling effect on the addition amount, and the leveling agent is more preferably a fluorine-based leveling agent from the viewpoint that it is less likely to cause bleeding (bloom or bleed).

Specific examples of the leveling agent include the compounds described in paragraphs [0079] to [0102] of JP2007-069471A, the compound represented by General Formula (I) described in JP2013-047204A (in particular, the compounds described in paragraphs [0020] to [0032]), the compound represented by General Formula (I) described in JP2012-211306A (in particular, the compounds described in paragraphs [0022] to [0029]), the liquid crystal alignment accelerator represented by General Formula (I) described in JP2002-129162A (in particular, the compounds described in paragraphs [0076] to [0078] and [0082] to [0084]), and the compounds represented by General Formulae (I), (II), and (III) described in JP2005-099248A (in particular, the compounds described in paragraphs [0092] to [0096]). In addition, the leveling agent may also function as an alignment control agent which will be described later.

[Alignment Control Agent]

The polymerizable liquid crystal composition of the present invention can contain an alignment control agent, as desired.

The alignment control agent can form an alignment state of homeotropic alignment (vertical alignment), in addition to homogeneous alignment.

As an alignment control agent which accelerates the homogeneous alignment, for example, a low-molecular-weight alignment control agent or a high-molecular-weight alignment control agent can be used.

With regard to the low-molecular-weight alignment control agent, reference can be made to the description in, for example, paragraphs [0009] to [0083] of JP2002-20363A, paragraphs [0111] to [0120] of JP2006-106662A, and paragraphs [0021] to [0029] of JP2012-211306A, the contents of which are hereby incorporated by reference.

In addition, with regard to the high-molecular-weight alignment control agent, reference can be made to the description in, for example, paragraphs [0021] to [0057] of JP2004-198511A and paragraphs [0121] to [0167] of JP2006-106662A, the contents of which are hereby incorporated by reference.

Furthermore, examples of the alignment control agent that forms or accelerates the homeotropic alignment include a boronic acid compound and an onium salt compound, and specifically, reference can be made to the compounds described in paragraphs [0023] to [0032] of JP2008-225281A, paragraphs [0052] to [0058] of JP2012-208397A, paragraphs [0024] to [0055] of JP2008-026730A, paragraphs [0043] to [0055] of JP2016-193869A, and the like, the contents of which are hereby incorporated by reference.

In a case where an alignment control agent is contained, a content thereof is preferably 0.01% to 10% by mass, and more preferably 0.05% to 5% by mass with respect to the mass of the total solid content of the composition. In a case where the content is within the range, it is possible to obtain a cured product which has no precipitation or phase separation, alignment defects, or the like, and is uniform and highly transparent while achieving a desired alignment state.

[Other Components]

The polymerizable liquid crystal composition of the present invention may contain components other than the above-mentioned components, and examples of such other components include a surfactant, a tilt angle control agent, an alignment assistant, a plasticizer, and a crosslinking agent.

The optically anisotropic layer of the embodiment of the present invention is a cured product obtained by immobilizing the above-mentioned polymerizable liquid crystal composition of the present invention in a liquid crystal state of a smectic phase.

Examples of a method for forming the cured product include a method in which the above-mentioned polymerizable liquid crystal composition of the present invention is used to cause a desired alignment state, and then immobilized by polymerization.

Here, the polymerization conditions are not particularly limited, but in the polymerization by irradiation with light, ultraviolet rays are preferably used. The irradiation dose is preferably 10 mJ/cm$^2$ to 50 J/cm$^2$, more preferably 20 mJ/cm$^2$ to 5 J/cm$^2$, still more preferably 30 mJ/cm$^2$ to 3 J/cm$^2$, and particularly preferably 50 mJ/cm$^2$ to 1,000 mJ/cm$^2$. In addition, the polymerization may be carried out under a heating condition in order to accelerate the polymerization reaction.

In addition, in the present invention, the cured product can be formed on any of supports in the optical film of the embodiment of the present invention, which will be described later or a polarizer in the polarizing plate of an embodiment of the present invention, which will be described later.

The optically anisotropic layer of the embodiment of the present invention is preferably an optically anisotropic layer satisfying Expression (III).

$$0.50 < Re(450)/Re(550) < 1.00 \quad \text{(III)}$$

Here, in Expression (III), Re(450) represents an in-plane retardation at a wavelength of 450 nm of the optically anisotropic layer, and Re(550) represents an in-plane retardation at a wavelength of 550 nm of the optically anisotropic layer. In addition, in the present specification, in a case where the measurement wavelength of the retardation is not specified, the measurement wavelength is 550 nm.

Furthermore, the values of the in-plane retardation and the thickness-direction retardation refer to values measured with light at the measurement wavelength using AxoScan OPMF-1 (manufactured by Opto Science, Inc.).

Specifically, by inputting the average refractive index ((Nx+Ny+Nz)/3) and the film thickness (d (μm)) to AxoScan OPMF-1, it is possible to calculate:
Slow axis direction (°)

$$Re(\lambda)=R0(\lambda)$$

$$Rth(\lambda)=((nx+ny)/2-nz)\times d.$$

In addition, R0(λ) is expressed in a numerical value calculated with AxoScan OPMF-1, but means Re(λ).

In addition, such an optically anisotropic layer is preferably a positive A plate or a positive C plate, and more preferably the positive A plate.

Here, the positive A plate (A plate which is positive) and the positive C plate (C plate which is positive) are defined as follows.

In a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz, the positive A plate satisfies the relationship of Expression (A1) and the positive C plate satisfies the relationship of Expression (C1). In addition, the positive A plate has an Rth showing a positive value and the positive C plate has an Rth showing a negative value.

$$nx>ny\approx nz \quad \text{Expression (A1)}$$

$$nz>nx\approx ny \quad \text{Expression (C1)}$$

Furthermore, the symbol, "≈", encompasses not only a case where the both sides are completely the same as each other but also a case where the both are substantially the same as each other.

The expression, "substantially the same", means that with regard to the positive A plate, for example, a case where (ny−nz)×d (in which d is the thickness of a film) is −10 to 10 nm, and preferably −5 to 5 nm is also included in "ny≈nz", and a case where (nx−nz)×d is −10 to 10 nm, and preferably −5 to 5 nm is also included in "nx≈nz". In addition, with regard to the positive C plate, for example, a case where (nx−ny)×d (in which d is the thickness of a film) is 0 to 10 nm, and preferably 0 to 5 nm is also included in "nx≈ny".

In a case where the optically anisotropic layer is a positive A plate, the Re(550) is preferably 100 to 180 nm, more preferably 120 to 160 nm, still more preferably 130 to 150 nm, and particularly preferably 130 to 140 nm, from the viewpoint that the optically anisotropic layer functions as a λ/4 plate.

Here, the "λ/4 plate" is a plate having a λ/4 function, specifically, a plate having a function of converting a linearly polarized light at a certain specific wavelength into a circularly polarized light (or converting a circularly polarized light to a linearly polarized light).

[Optical Film]

The optical film of an embodiment of the present invention is an optical film having the optically anisotropic layer of the embodiment of the present invention.

FIG. 1 is a schematic cross-sectional view showing an example of the optical film of an embodiment of the present invention.

Furthermore, FIG. 1 is a schematic view, and the thicknesses relationship, the positional relationship, and the like among the respective layers are not necessarily consistent with actual ones, and either of the support shown in FIG. 1 and an alignment film are optional constitutional members.

An optical film 10 shown in FIG. 1 has a support 16, an alignment film 14, and an optically anisotropic layer 12 as the cured product in this order.

In addition, the optically anisotropic layer 12 may be a laminate of two or more different optically anisotropic layers. For example, in a case where the polarizing plate of an embodiment of the present invention which will be described later is used as a circularly polarizing plate or in a case where the optical film of an embodiment of the present invention is used as an optical compensation film for an IPS mode or an FFS mode liquid crystal display device, the optically anisotropic layer 12 is preferably a laminate of a positive A plate and a positive C plate.

In addition, the optically anisotropic layer may be peeled from the support, and the optically anisotropic layer may be used alone as an optical film.

Hereinafter, various members used for the optical film of the embodiment of the present invention will be described in detail.

[Optically Anisotropic Layer]

An optically anisotropic layer included in the optical film of the embodiment of the present invention is the above-mentioned optically anisotropic layer of the embodiment of the present invention.

In the optical film of the embodiment of the present invention, a thickness of the optically anisotropic layer is not particularly limited, but is preferably 0.1 to 10 μm, and more preferably 0.5 to 5 μm.

[Support]

The optical film of the embodiment of the present invention may have a support as a base material for forming an optically anisotropic layer as mentioned above.

Such a support is preferably transparent, and specifically, it preferably has a light transmittance of 80% or more.

Examples of such a support include a glass substrate and a polymer film, and examples of the material for the polymer film include cellulose-based polymers; acrylic polymers having an acrylic ester polymer such as polymethyl methacrylate and a lactone ring-containing polymer, thermoplastic norbornene-based polymers; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; vinyl chloride-based polymers; amide-based polymers such as nylon and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers obtained by mixing these polymers.

In addition, an aspect in which a polarizer which will be described later may also function as such a support is also available.

In the present invention, a thickness of the support is not particularly limited, but is preferably 5 to 60 μm, and more preferably 5 to 40 μm.

[Alignment Film]

In a case where the optical film of the embodiment of the present invention has any of the above-mentioned supports, it is preferable that the optical film has an alignment film between the support and the optically anisotropic layer. Furthermore, an aspect in which the above-mentioned support may also function as an alignment film is also available.

The alignment film generally has a polymer as a main component. The polymer materials for an alignment film are described in many documents, and many commercially available products can be used.

The polymer material used in the present invention is preferably a polyvinyl alcohol or a polyimide, or a derivative thereof. Particularly, a modified or non-modified polyvinyl alcohol is preferable.

Examples of the alignment film that can be used in the present invention include the alignment films described for Line 24 on Page 43 to Line 8 on Page 49 of WO01/88574A; the modified polyvinyl alcohols described in paragraphs [0071] to [0095] of JP3907735B; and the liquid crystal alignment film formed by a liquid crystal alignment agent described in JP2012-155308A.

In the present invention, for a reason that it is possible to prevent deterioration in the surface condition by avoiding a contact with the surface of an alignment film upon formation of the alignment film, a photo-alignment film is also preferably used as the alignment film.

The photo-alignment film is not particularly limited, but the polymer materials such as a polyamide compound and a polyimide compound, described in paragraphs 0024 to 0043 of WO2005/096041A; the liquid crystal alignment film formed by a liquid crystal alignment agent having a photo-alignment group, described in JP2012-155308A; LPP-JP265CP, trade name, manufactured by Rolic Technologies Ltd.; or the like can be used.

In addition, in the present invention, the thickness of the alignment film is not particularly limited, but from the viewpoint of forming an optically anisotropic layer having a uniform film thickness by mitigating the surface roughness that can be present on the support, the thickness is preferably 0.01 to 10 µm, more preferably 0.01 to 1 µm, and still more preferably 0.01 to 0.5 µm.

[Ultraviolet Absorber]

The optical film of the embodiment of the present invention preferably includes an ultraviolet (UV) absorber, taking an effect of external light (particularly ultraviolet rays) into consideration.

The ultraviolet absorber may be contained in the optically anisotropic layer of the embodiment of the present invention or may also be contained in a member other than an optically anisotropic layer constituting the optical film of the embodiment of the present invention. Suitable examples of the member other than the optically anisotropic layer include a support.

As the ultraviolet absorber, any one of ultraviolet absorbers known in the related art, which can express ultraviolet absorptivity, can be used. Among such the ultraviolet absorbers, a benzotriazole-based or hydroxyphenyltriazine-based ultraviolet absorber is preferably used from the viewpoint that it has high ultraviolet absorptivity and ultraviolet absorbing ability (ultraviolet-shielding ability) used for an image display device is obtained.

In addition, in order to broaden ultraviolet absorbing ranges, two or more kinds of ultraviolet absorbers having different maximum absorption wavelengths can be used in combination.

Specific examples of the ultraviolet absorber include the compounds described in paragraphs [0258] and [0259] of JP2012-18395A and the compounds described in paragraphs [0055] to [0105] of JP2007-72163A.

In addition, as a commercially available product thereof, for example, Tinuvin 400, Tinuvin 405, Tinuvin 460, Tinuvin 477, Tinuvin 479, and Tinuvin 1577 (all manufactured by BASF), or the like can be used.

[Polarizing Plate]

A polarizing plate of an embodiment of the present invention has the above-mentioned optical film of the embodiment of the present invention and a polarizer.

Furthermore, in a case where the above-mentioned optically anisotropic layer of the embodiment of the present invention is a $\lambda/4$ plate (positive A plate), the polarizing plate of the embodiment of the present invention can be used as a circularly polarizing plate.

In a case where the polarizing plate of the embodiment of the present invention is used as a circularly polarizing plate, the above-mentioned optically anisotropic layer of the embodiment of the present invention is used as a $\lambda/4$ plate (positive A plate), and an angle formed by the slow axis of the $\lambda/4$ plate and the absorption axis of a polarizer which will be described later is preferably 30° to 60°, more preferably 40° to 50°, still more preferably 42° to 48°, and particularly preferably 45°.

In addition, the polarizing plate of the embodiment of the present invention can also be used as an optical compensation film for an IPS mode or FFS mode liquid crystal display device.

In a case where the polarizing plate of the embodiment of the present invention is used as an optical compensation film for an IPS mode or FFS mode liquid crystal display device, it is preferable that the above-mentioned optically anisotropic layer of the embodiment of the present invention is used as at least one plate of a laminate of a positive A plate and a positive C plate, an angle formed by the slow axis of the positive A plate layer and the absorption axis of a polarizer which will be described later are orthogonal or parallel, and specifically, it is more preferable that an angle formed by the slow axis of the positive A plate layer and the absorption axis of the polarizer which will be described later is 0° to 5° or 85° to 95°.

Here, the "slow axis" of the $\lambda/4$ plate or the positive A plate layer means a direction in which a refractive index in the plane of the $\lambda/4$ plate or the positive A plate layer is maximum, and the "absorption axis" of the polarizer means a direction in which the absorbance is highest.

[Polarizer]

A polarizer contained in a polarizing plate of an embodiment of the present invention is not particularly limited as long as it is a member having a function of converting light into specific linearly polarized light, and an absorptive type polarizer and a reflective type polarizer, which are known in the related art, can be used.

An iodine-based polarizer, a dye-based polarizer using a dichroic dye, a polyene-based polarizer, or the like is used as the absorptive type polarizer. The iodine-based polarizer and the dye-based polarizer are classified into a coating type polarizer and a stretching type polarizer, any of which can be applied, but a polarizer which is manufactured by allowing polyvinyl alcohol to adsorb iodine or a dichroic dye and performing stretching is preferable.

In addition, examples of a method of obtaining a polarizer by carrying out stretching and dyeing in a state of a laminated film in which a polyvinyl alcohol layer is formed on a base material include the methods disclosed in JP5048120B, JP5143918B, JP4691205B, JP4751481B, and JP4751486B, and known technologies relating to these polarizers can also be preferably used.

A polarizer in which thin films having different birefringence are laminated, a wire grid-type polarizer, a polarizer having a combination of a cholesteric liquid crystal having a selective reflection range, and a ¼ wavelength plate, or the like is used as the reflective type polarizer.

Among those, a polarizer including a polyvinyl alcohol-based resin (a polymer including —CH$_2$—CHOH— as a repeating unit, in particular, at least one selected from the group consisting of a polyvinyl alcohol and an ethylene-vinyl alcohol copolymer) is preferable from the viewpoint that it has more excellent adhesiveness.

In the present invention, the thickness of the polarizer is not particularly limited, but is preferably 3 µm to 60 µm, more preferably 3 µm to 30 µm, and still more preferably 3 µm to 10 µm.

[Pressure Sensitive Adhesive Layer]

The polarizing plate of the embodiment of the present invention may have a pressure sensitive adhesive layer arranged between the optically anisotropic layer in the optical film of the embodiment of the present invention and the polarizer.

The pressure sensitive adhesive layer used for lamination of the cured product and the polarizer represents, for example, a substance in which a ratio (tan δ=G"/G') between a storage elastic modulus G' and a loss elastic modulus G", each measured with a dynamic viscoelastometer, is 0.001 to 1.5, and examples thereof include a so-called pressure sensitive adhesive or a readily creepable substance. Examples of the pressure sensitive adhesive that can be used in the present invention include a polyvinyl alcohol-based pressure sensitive adhesive, but the pressure sensitive adhesive is not limited thereto.

[Adhesive Layer]

The polarizing plate of the embodiment of the present invention may have an adhesive layer arranged between the optically anisotropic layer in the optical film of the embodiment of the present invention and the polarizer.

As the adhesive layer used for laminating a cured product and a polarizer, a curable adhesive composition that is cured by irradiation with active energy rays or heating is preferable.

Examples of the curable adhesive composition include a curable adhesive composition containing a cationically polymerizable compound and a curable adhesive composition containing a radically polymerizable compound.

A thickness of the adhesive layer is preferably 0.01 to 20 µm, more preferably 0.01 to 10 µm, and still more preferably 0.05 to 5 µm. In a case where the thickness of the adhesive layer is within this range, floating or peeling does not occur between the protective layer or optically anisotropic layer and the polarizer, which are laminated, and a practically acceptable adhesive force can be obtained.

[Image Display Device]

An image display device of an embodiment of the present invention is an image display device having the optical film of the embodiment of the present invention or the polarizing plate of the embodiment of the present invention.

A display element used in the image display device of the embodiment of the present invention is not particularly limited, and examples thereof include a liquid crystal cell, an organic electroluminescent (hereinafter simply referred to as "EL") display panel, and a plasma display panel.

Among those, the liquid crystal cell and the organic EL display panel are preferable, and the liquid crystal cell is more preferable. That is, as the image display device of the embodiment of the present invention, a liquid crystal display device using a liquid crystal cell as a display element or an organic EL display device using an organic EL display panel as a display element is preferable, and the liquid crystal display device is more preferable.

[Liquid Crystal Display Device]

A liquid crystal display device which is an example of the image display device of the embodiment of the present invention is a liquid crystal display device having the above-mentioned polarizing plate of the embodiment of the present invention and a liquid crystal cell.

In addition, in the present invention, it is preferable that the polarizing plate of the embodiment of the present invention is used as the polarizing plate of the front side, and it is more preferable that the polarizing plate of the embodiment of the present invention is used as the polarizing plates on the front and rear sides, among the polarizing plates provided on the both sides of the liquid crystal cell.

Hereinafter, the liquid crystal cell constituting the liquid crystal display device will be described in detail.

<Liquid Crystal Cell>

The liquid crystal cell used for the liquid crystal display device is preferably in a vertical alignment (VA) mode, an optically compensated bend (OCB) mode, an in-plane-switching (IPS) mode, a fringe-field-switching (FFS) mode, or a twisted nematic (TN) mode, but is not limited thereto.

In a TN-mode liquid crystal cell, rod-shaped liquid crystal molecules are substantially horizontally aligned and are twist-aligned at 60° to 120° during no voltage application thereto. A TN-mode liquid crystal cell is most often used in a color TFT liquid crystal display device and described in numerous documents.

In a VA-mode liquid crystal cell, rod-shaped liquid crystal molecules are substantially vertically aligned during no voltage application thereto. Examples of the VA-mode liquid crystal cell include (1) a VA-mode liquid crystal cell in the narrow sense of the word, in which rod-shaped liquid crystal molecules are substantially vertically aligned during no voltage application thereto, but are substantially horizontally aligned during voltage application thereto (described in JP1990-176625A (JP-H02-176625A)), (2) an MVA-mode liquid crystal cell in which the VA-mode is multi-domained for viewing angle enlargement (described in SID97, Digest of Tech. Papers (preprint), 28 (1997) 845), (3) a liquid crystal cell in a mode (n-ASM mode) in which rod-shaped liquid crystal molecules are substantially vertically aligned during no voltage application thereto and are multi-domain-aligned during voltage application thereto (described in Seminar of Liquid Crystals of Japan, Papers (preprint), 58-59 (1998)), and (4) a survival-mode liquid crystal cell (announced in LCD International 98). In addition, the liquid crystal cell may be of any of a patterned vertical alignment (PVA) type, an optical alignment type, and a polymer-sustained alignment (PSA) type. Details of these modes are specifically described in JP2006-215326A and JP2008-538819A.

In an IPS-mode liquid crystal cell, rod-shaped liquid crystal molecules are aligned substantially parallel with respect to a substrate, and application of an electric field parallel to the substrate surface causes the liquid crystal molecules to respond planarly. The IPS-mode displays black in a state where no electric field is applied and a pair of upper and lower polarizing plates have absorption axes which are orthogonal to each other. A method of improving the viewing angle by reducing light leakage during black display in an oblique direction using an optical compensation sheet is disclosed in JP1998-54982A (JP-H10-54982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

Suitable examples of the organic EL display device which is an example of the image display device of the embodiment of the present invention include an aspect which includes, from the visible side, a polarizer, a λ/4 plate (a positive A plate) including the optically anisotropic layer of the embodiment of the present invention, and an organic EL display panel in this order.

Furthermore, the organic EL display panel is a display panel composed of an organic EL device in which an organic light emitting layer (organic electroluminescent layer) is sandwiched between electrodes (between a cathode and an anode). The configuration of the organic EL display panel is not particularly limited but a known configuration is adopted.

EXAMPLES

Hereinafter, the present invention will be described in more detail with reference to Examples. The materials, the amounts of materials used, the proportions, the treatment details, the treatment procedure, and the like shown in Examples below can be appropriately modified as long as the modifications do not depart from the spirit of the present invention. Therefore, the scope of the present invention should not be construed as being limited to Examples shown below.

Example 1

[Manufacture of Protective Film 1]
<Preparation of Core Layer Cellulose Acylate Dope 1>

The following composition was put into a mixing tank and stirred to dissolve the respective components to prepare a core layer cellulose acylate dope 1.

| Core layer cellulose acylate dope 1 | |
|---|---|
| Cellulose acetate having a degree of acetyl substitution of 2.88 | 100 parts by mass |
| Ester oligomer (the following compound 1-1) | 10 parts by mass |
| Durability improver (the following compound 1-2) | 4 parts by mass |
| Ultraviolet absorber (the following compound 1-3) | 3 parts by mass |
| Methylene chloride (the first solvent) | 438 parts by mass |
| Methanol (the second solvent) | 65 parts by mass |

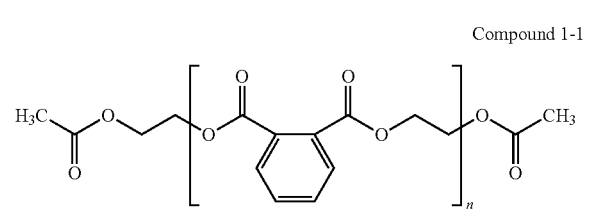

Compound 1-1

Compound 1-2

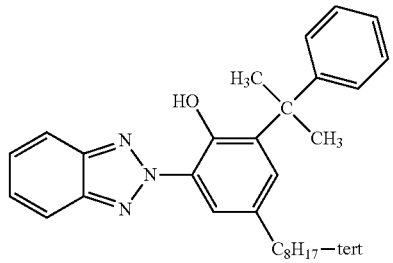

Compound 1-3

<Preparation of Outer Layer Cellulose Acylate Dope 1>

10 parts by mass of the following matting agent dispersion liquid 1 was added to 90 parts by mass of the core layer cellulose acylate dope 1 to prepare an outer layer cellulose acylate dope 1.

| Matting agent solution | |
|---|---|
| Silica particles with an average particle size of 20 nm (AEROSIL R972, manufactured by Nippon Aerosil Co., Ltd.) | 2 parts by mass |
| Methylene chloride (the first solvent) | 76 parts by mass |
| Methanol (the second solvent) | 11 parts by mass |
| Core layer cellulose acylate dope 1 | 1 part by mass |

<Manufacture of Protective Film 1 for Polarizer>

Three layers of the core layer cellulose acylate dope 1 and the outer layer cellulose acylate dopes 1 on both sides thereof were simultaneously casted from a casting port onto a drum at 20° C. In a state where a content of the solvent in the film on the drum was approximately 20% by mass, the film was peeled from the drum, and both ends of the obtained film in the width direction were fixed with tenter clips, and in a state where a content of the residual solvent in the film was 3% to 15% by mass, the film was stretched 1.2 times in the transverse direction and dried. Thereafter, the obtained film was transported between the rolls of a heat treatment device to manufacture a cellulose acylate film 1 with a thickness of 25 μm, which was used as a protective film 1.

[Manufacture of Protective Film 1 with Hardcoat Layer]

As a coating liquid for forming a hardcoat layer, a curable composition (hardcoat layer 1) for a hardcoat layer described in Table 4 below was prepared.

TABLE 4

|  | Monomer | | | | UV initiator | | |
|---|---|---|---|---|---|---|---|
|  | Monomer 1 | Monomer 2 | Monomer 1/ monomer 2 | Sum of addition amounts [parts by mass] | Type | Addition amount [parts by mass] | Solvent |
| Hardcoat layer 1 | Pentaerythritol triacrylate | Pentaerythritol tetraacrylate | 3/2 | 53.5 | UV initiator 1 | 1.5 | Ethyl acetate |

The structure of a UV initiator 1 in Table 4 above is shown below.

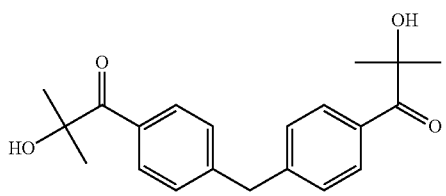 [SMILES: CC(C)(O)C(=O)c1ccc(Cc2ccc(C(=O)C(C)(C)O)cc2)cc1]

The curable composition 1 for a hardcoat layer was applied onto a surface of the protective film 1 for a polarizer manufactured above, then dried at 100° C. for 60 seconds, irradiated with UV at 1.5 kW and 300 mJ under the condition of 0.1% or less of nitrogen, and cured to manufacture a protective film 1 with a hardcoat layer, having a hardcoat layer with a film thickness of 5 μm. Furthermore, adjustment of the film thickness of the hardcoat layer was performed by adjusting a coating amount by a die coating method, using a slot die.

[Manufacture of Polarizing Plate 1 with Protective Film on One Surface]

(1) Saponification of Film

The manufactured protective film 1 with a hardcoat layer was immersed for 1 minute in a 4.5 mol/L aqueous sodium hydroxide solution (saponified solution) whose temperature had been adjusted to 37° C., and then the film was washed with water, then immersed in a 0.05 mol/L aqueous sulfuric acid solution for 30 seconds, and then further passed through a water washing bath. Then, the obtained film was repeatedly dehydrated three times with an air knife to drop water, and then the film was dried by leaving it in a drying zone at 70° C. for 15 seconds to manufacture a protective film 1 with a hardcoat layer, which had been saponified.

(2) Manufacture of Polarizer

According to Examples of JP2016-148724A, a polarizer with a film thickness of 15 μm was prepared by providing a peripheral speed difference between two pairs of nip rolls and performing stretching in the longitudinal direction. The polarizer thus manufactured was used as a polarizer 1.

(3) Bonding

The polarizer 1 thus obtained and the protective film 1 with a hardcoat layer which had been subjected to the saponification treatment were bonded in a roll-to-roll manner so that the polarizing axis and the longitudinal direction of the film was orthogonal to each other, using a 3% aqueous PVA solution (manufactured by Kuraray Co., Ltd., PVA-117H) as an adhesive, thereby manufacturing a polarizing plate 1 with a protective film on one surface (hereinafter also simply referred to as a "polarizing plate 1"). At this time, the bonding was performed so that the cellulose acylate film side of the protective film came on the polarizer side.

[Manufacture of Polarizing Plate 2 with Protective Film on One Surface]

A polarizing plate 2 with a protective film on one surface (hereinafter also simply referred to as a "polarizing plate 2") was manufactured in the same manner as in the manufacture of the polarizing plate 1, except that a hardcoat layer was not provided on a surface of the protective film 1. Furthermore, each liquid crystal display device was manufactured, using the polarizing plate 1 on a visible side and the polarizing plate 2 on a backlight side, in particular, unless otherwise specified in the following Examples and Comparative Examples.

[Manufacture of Protective Film 2]

<Manufacture of Core Layer Cellulose Acylate Dope 2>

The following composition was put into a mixing tank and stirred to dissolve the respective components to prepare a core layer cellulose acylate dope 2.

| Core layer cellulose acylate dope 2 | |
|---|---|
| Cellulose acetate having a degree of acetyl substitution of 2.88 | 100 parts by mass |
| The following polyester | 12 parts by mass |
| The durability improver (the compound 1-2) | 4 parts by mass |
| Methylene chloride (the first solvent) | 430 parts by mass |
| Methanol (the second solvent) | 64 parts by mass |

Polyester (Number-Average Molecular Weight of 800)

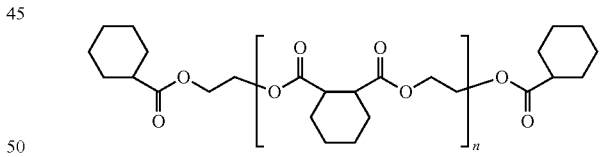

<Manufacture of Outer Layer Cellulose Acylate Dope 2>

10 parts by mass of the following matting agent solution was added to 90 parts by mass of the core layer cellulose acylate dope 2 to prepare an outer layer cellulose acylate dope 2.

| Matting agent solution | |
|---|---|
| Silica particles with an average particle size of 20 nm (AEROSIL R972, manufactured by Nippon Aerosil Co., Ltd.) | 2 parts by mass |
| Methylene chloride (the first solvent) | 76 parts by mass |
| Methanol (the second solvent) | 11 parts by mass |
| Core layer cellulose acylate dope | 1 part by mass |

<Manufacture of Protective Film 2>

The core layer cellulose acylate dope 2 and the outer layer cellulose acylate dope 2 were filtered through a filter paper with an average pore diameter of 34 μm and a sintered metal filter with an average pore diameter of 10 μm, and then all of the three layers of the core layer cellulose acylate dope 2 and the outer layer cellulose acylate dopes 2 on both sides thereof were simultaneously cast on a drum at 20° C. from a casting port (band casting machine).

Subsequently, the film was peeled from the drum in a state where a content of the solvent of the film on the drum reached approximately 20% by mass, the both ends of the film in the width direction were fixed with tenter clips, and the film was dried while being stretched at a stretching ratio of 1.1 times in the transverse direction.

Thereafter, the obtained film was transported between the rolls of a heat treatment device and further dried to manufacture a cellulose acylate film 2 with a film thickness of 40 μm, which was used as a protective film 2. The results of the measurement of a phase difference of the protective film 2 were as follows: Re=1 nm and Rth=−5 nm.

[Manufacture of Optically Anisotropic Layer 1]

<Preparation of Composition 1 for Photo-Alignment Film>

The photo-alignment film forming material described in Example 1 of WO2016/002722A was prepared.

<Preparation of Composition for Forming Optically Anisotropic Layer>

A composition for forming an optically anisotropic layer having the following composition was prepared.

| Composition 1 for forming an optically anisotropic layer | |
|---|---|
| The following polymerizable, smectic rod-shaped liquid crystal compound S1 | 80.0 parts by mass |
| The following additive V2 | 20.0 parts by mass |
| The following photopolymerization initiator B1 | 1.0 part by mass |
| Monomer M1 (NK ESTER A-200, manufactured by Shin Nakamura Chemical Co., Ltd.) | 1.0 part by mass |
| The following polymer P1 | 0.09 parts by mass |
| Methyl ethyl ketone | 190.33 parts by mass |
| Cyclopentanone | 47.58 parts by mass |

Polymerizable Smectic Rod-Shaped Liquid Crystal Compound S1

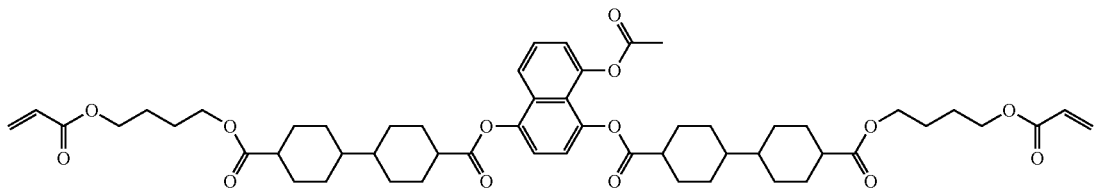 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c(OC(C)=O)cccc34)CC2)CC1]

Additive V2

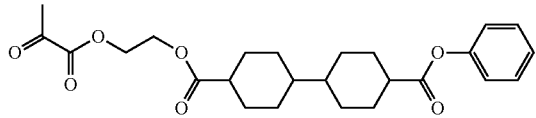

Photopolymerization Initiator B1

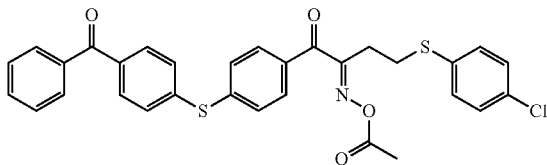 [SMILES: CC(=O)O/N=C(\CCSc1ccc(Cl)cc1)C(=O)c1ccc(Sc2ccc(C(=O)c3ccccc3)cc2)cc1]

Polymer P1 (in the following formula: a and b satisfy a:b=65:35, and represent contents (% by mole) of the respective repeating unit with respect to all repeating units in the resin).

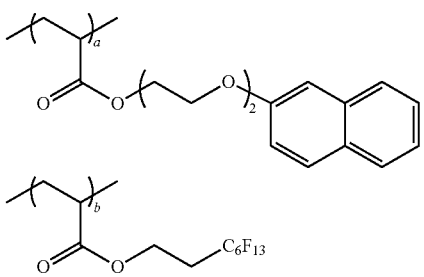

<Manufacture of Optically Anisotropic Layer 1>

The composition 1 for a photo-alignment film prepared above was applied onto one surface of the manufactured protective film 2 under the condition of a transport speed of 30 m/min by a die coating method, using the slot die described in Example 1 of JP2006-122889A, and dried at 120° C. for 1 minute to remove the solvent. Thereafter, the film was irradiated with polarized ultraviolet rays (10 mJ/cm$^2$, using an ultra-high-pressure mercury lamp), to form a photo-alignment film 1 with a thickness of 0.3 μm.

Subsequently, the composition 1 for forming an optically anisotropic layer prepared above was continuously applied onto the photo-alignment film 1 to 3,800 m with a coating width of 1,300 mm under the condition of a transport speed of 30 m/min by a die coating method, heated to 110° C., and then cooled to 60° C. to stabilize the alignment.

Thereafter, while keeping the temperature at 60° C., the alignment was immobilized by irradiation with ultraviolet rays (500 mJ/cm$^2$, using an ultra-high-pressure mercury lamp) in a nitrogen atmosphere (an oxygen concentration of 100 ppm), to form an optically anisotropic layer with a thickness of 2 μm.

Incidentally, the molecular length (Å) and SP value of the polymerizable smectic rod-shaped liquid crystal compound and the additive contained in the composition 1 for forming an optically anisotropic layer, and the values in Expressions (1-1) and (2-1) are shown in Table 5 below.

Examples 2 to 8 and Comparative Examples 1 to 4

An optically anisotropic layer was manufactured by the same method as in Example 1, except that the polymerizable smectic rod-shaped liquid crystal compound and the additive were changed to the compounds shown in Table 5 below.

Furthermore, in Table 5 below, the structures of the polymerizable smectic rod-shaped liquid crystal compound and the like are shown below.

Furthermore, a group adjacent to the acryloyloxy group of the following polymerizable smectic rod-shaped liquid crystal compound S2 and liquid crystal compound T2 represents a propylene group (a group obtained by substituting a methyl group with an ethylene group), and the following polymerizable smectic rod-shaped liquid crystal compound S2 and liquid crystal compound T2 each represent a mixture of regioisomers having different positions of the methyl groups.

Polymerizable Smectic Rod-Shaped Liquid Crystal Compound S2

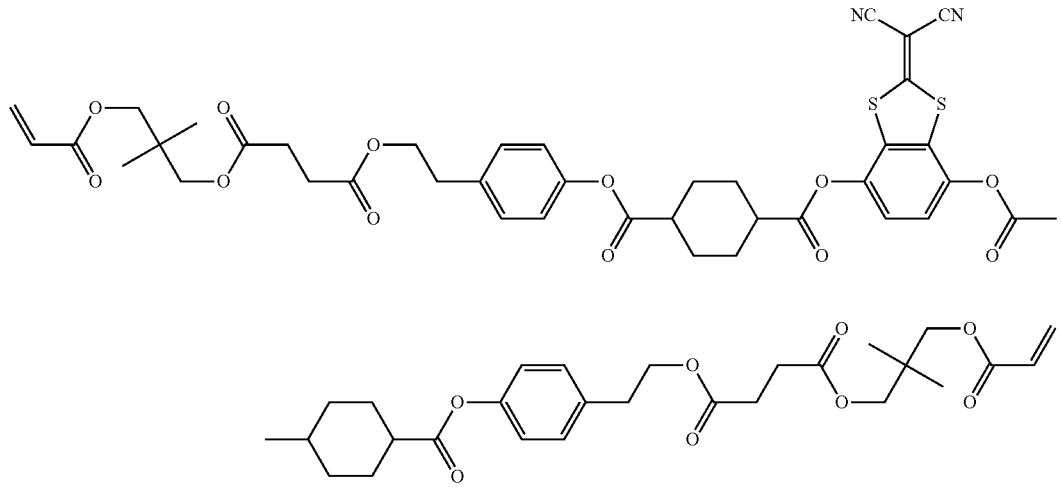

Polymerizable Smectic Rod-Shaped Liquid Crystal Compound S3

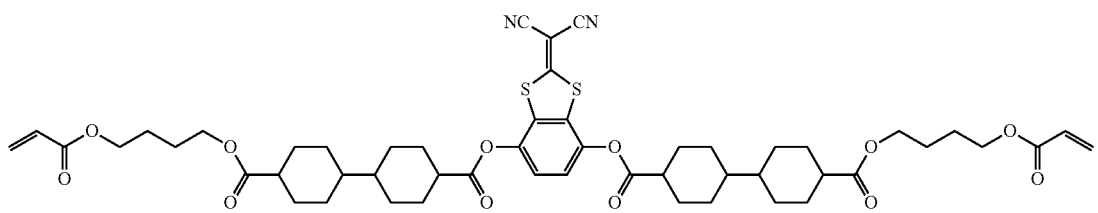 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Liquid Crystal Compound T1

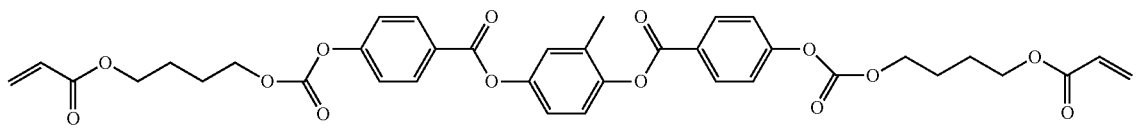 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Liquid Crystal Compound T2

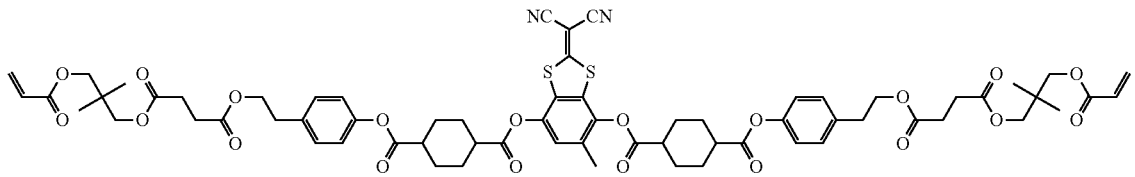 [SMILES: C=CC(=O)OCC(C)(C)COC(=O)CCC(=O)OCCc1ccc(OC(=O)C2CCC(C(=O)Oc3cc(C)c(OC(=O)C4CCC(C(=O)Oc5ccc(CCOC(=O)CCC(=O)OCC(C)(C)COC(=O)C=C)cc5)CC4)c4c3SC(=C(C#N)C#N)S4)CC2)cc1]

Liquid Crystal Compound T3
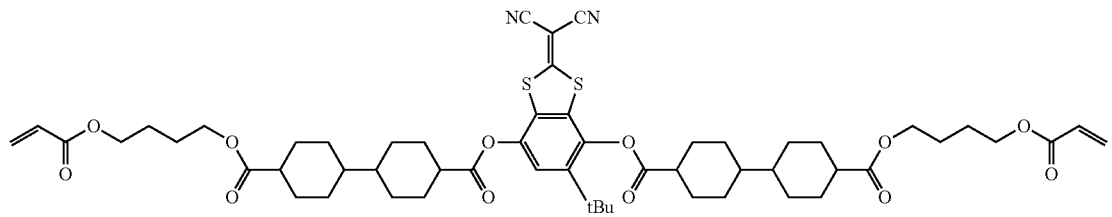 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]
Liquid Crystal Compound T4 (Polyfunctional Liquid Crystal Compound)
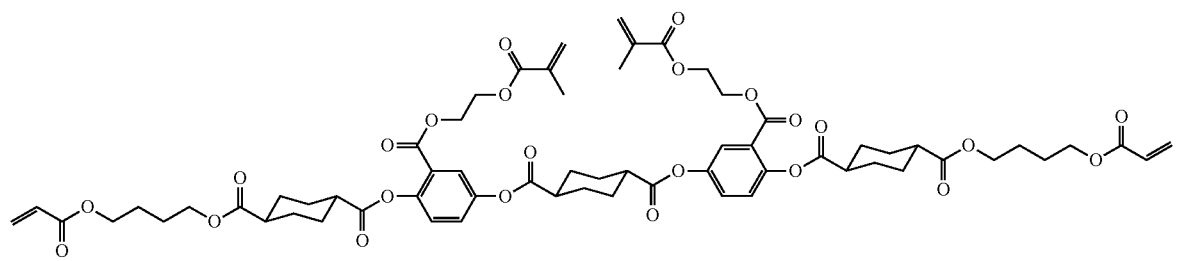 [SMILES: C=CC(=O)OCCCCOC(=O)C1CCC(C(=O)Oc2ccc(OC(=O)C3CCC(C(=O)Oc4ccc(OC(=O)C5CCC(C(=O)OCCCCOC(=O)C=C)CC5)c(C(=O)OCCOC(=O)C(=C)C)c4)CC3)cc2C(=O)OCCOC(=O)C(=C)C)CC1]
Additive V1
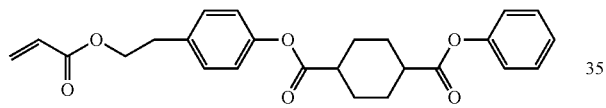
Additive V3
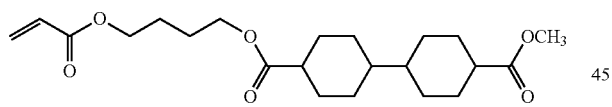
Additive V4
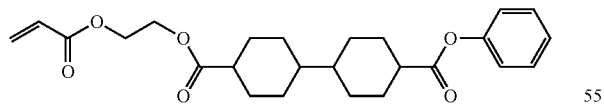
Additive V5
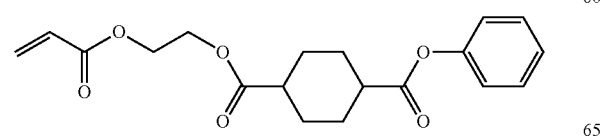

Additive V6

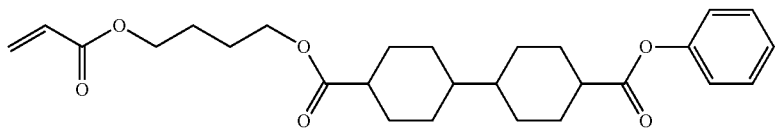 [SMILES: C=CC(=O)OCCCCOC(=O)C1CCC(C2CCC(C(=O)Oc3ccccc3)CC2)CC1]

Additive V7

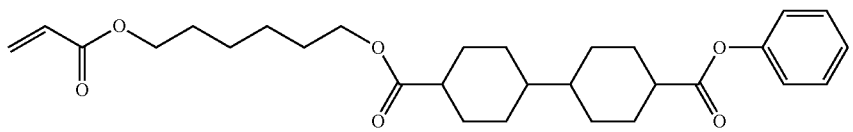

Polymer P2 (in the following formulae, a to c satisfy a:b:c=66:26:8 and represent contents (% by mole) of the respective repeating unit with respect to all repeating units in the resin)

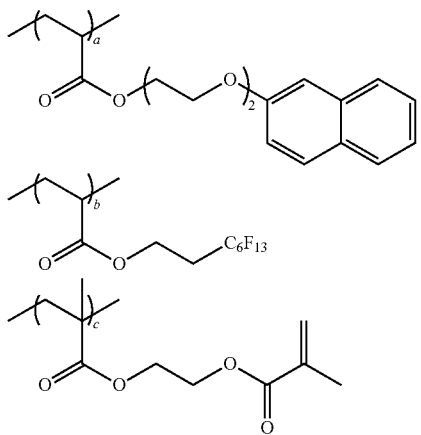

[Evaluation]
<Contrast>

Measurement of a contrast was performed with a laminate in which a direct-type LED backlight light source, an upper polarizing plate, the manufactured optically anisotropic layer, and a lower polarizing plate were arranged on a table in order from the bottom so that the respective surfaces were horizontal. At this time, the manufactured optically anisotropic layer and the upper polarizing plate were made rotatable.

A luminance of the light emitted from the light source and transmitted through the upper polarizing plate, the manufactured optically anisotropic layer, and the lower polarizing plate in this order was measured from the vertical direction, using a luminance meter (BM-5A, manufactured by TOP-CON).

In the measurement, first, the upper polarizing plate was rotated in the absence of a sample and adjusted to a position where the luminance was the darkest (a state of crossed nicols).

Subsequently, a sample was then inserted and rotated under crossed nicols to measure a minimum luminance.

Next, two polarizing plates, an upper polarizing plate, and a lower polarizing plate were arranged in the alignment of parallel nicols, and the sample was rotated to measure a maximum luminance.

In order to eliminate the contribution of luminance leakage caused by the upper polarizing plate and the lower polarizing plate, a value obtained by the following expression was defined as a contrast of the film and evaluated according to the following standard. The results are shown in Table 5 below.

Contrast=1/[{(Minimum luminance under crossed nicols in a case where the film is arranged)/ (Maximum luminance under parallel nicols in a case where the film is arranged)}-{(Minimum luminance under crossed nicols in the absence of the sample)/(Maximum luminance under parallel nicols in the absence of the sample)}]

<Evaluation Standard>
A: 120,000 or more
B: 50,000 or more and less than 120,000
C: 10,000 or more and less than 50,000
D: Less than 10,000

<Surface Condition>

In the manufacture of an optically anisotropic layer, a sample in 50 mm in the transport direction×1,300 mm in the width direction was cut out at a point 3,800 m from the start of application in the longitudinal direction, from the start of application of the composition for forming an optically anisotropic layer.

The cut sample was arranged between the polarizing plates arranged on the crossed nicols, and the surface condition was observed and evaluated according to the following standard. The results are shown in Table 5 below.

<Evaluation Standard>
AAA: No streaks are visible
AA: Partly very weak streaks are generated, which is not cared
A: Partly weak streaks are generated, which is not cared
B: Weak streaks are generated on the entire surface, which is not cared
C: Weak streaks on the entire surface and partial strong streaks are generated, which is cared
D: Strong streaks are generated on the entire surface, which is much cared

TABLE 5

| | Polymerizable smectic rod-shaped liquid crystal compound | | | Other liquid crystal compounds | | | | Additive | | | | | | |
|---|---|---|---|---|---|---|---|---|---|---|---|---|---|---|
| | S1 | S2 | S3 | T1 | T2 | T3 | T4 | V1 | V2 | V3 | V4 | V5 | V6 | V7 |
| Molecular length (Å) | 51 | 64 | 50 | — | — | — | — | 25 | 25 | 24 | 25 | 21 | 28 | 30 |
| SP value | 20 | 21.3 | 20 | — | — | — | — | 21.3 | 19.9 | 19.4 | 20.4 | 21.3 | 20.2 | 20 |
| Example 1 | 80.0 | | | | | | | | 20.0 | | | | | |
| Example 2 | | 40.0 | | | | 40.0 | | | 12.0 | | | | | |
| Example 3 | | 40.0 | | | | 40.0 | | | 12.0 | | | | | |
| Example 4 | | 40.0 | | | | 40.0 | | | | | 12.0 | | | |
| Example 5 | | 40.0 | | | | 40.0 | | | | | | 12.0 | | |
| Example 6 | | 40.0 | | | | 40.0 | | | | | | | 12.0 | |
| Example 7 | | 40.0 | | | 40.0 | | | 12.0 | | | | | | |
| Example 8 | | 40.0 | | | | 30.0 | 10.0 | 12.0 | | | | | | |
| Comparative Example 1 | | | | 80.0 | | | | | | | | | | |
| Comparative Example 2 | | 40.0 | | | | 40.0 | | | | | | | | |
| Comparative Example 3 | | 40.0 | | | | 40.0 | | | | | | 12.0 | | |
| Comparative Example 4 | | 40.0 | | | | 40.0 | | | | | | | | 12.0 |

| | Photo polymerization initiator | Monomer | Polymer | | Expression (1-1) | | Expression (2-1) | Note | |
|---|---|---|---|---|---|---|---|---|---|
| | | | | | | | | | Surface |
| | B1 | M1 | P1 | P2 | 0.5 × B | C | 0.6 × A | $|SP_A - SP_c|$ | Contrast | condition |
| Molecular length (Å) | — | — | — | — | — | — | — | — | | |
| SP value | — | — | — | — | — | — | — | — | | |
| Example 1 | 1.0 | 1.0 | 0.2 | | 20.6 | 25.0 | 30.6 | 0.1 | B | A |
| Example 2 | 1.0 | 1.0 | 0.2 | | 20.6 | 25.0 | 30.0 | 0.1 | B | A |
| Example 3 | 1.0 | 1.0 | | 0.2 | 20.6 | 25.0 | 30.0 | 0.1 | A | AA |
| Example 4 | 1.0 | 1.0 | 0.2 | | 20.6 | 23.8 | 30.0 | 0.6 | B | B |
| Example 5 | 1.0 | 1.0 | 0.2 | | 20.6 | 24.7 | 30.0 | 0.4 | B | B |
| Example 6 | 1.0 | 1.0 | 0.2 | | 20.6 | 27.8 | 30.0 | 0.2 | B | A |
| Example 7 | 1.0 | 1.0 | | 0.2 | 24.5 | 25.1 | 38.6 | 0.0 | A | AA |
| Example 8 | 1.0 | 1.0 | | 0.2 | 24.5 | 25.1 | 38.6 | 0.0 | A | AAA |

TABLE 5-continued

| | | | | | | | | | | |
|---|---|---|---|---|---|---|---|---|---|---|
| Comparative Example 1 | 1.0 | 1.0 | 0.2 | — | — | — | — | | C | B |
| Comparative Example 2 | 1.0 | 1.0 | 0.2 | — | — | — | — | | D | D |
| Comparative Example 3 | 1.0 | 1.0 | 0.2 | 20.6 | 20.5 | 30.0 | 1.3 | | B | D |
| Comparative Example 4 | 1.0 | 1.0 | 0.2 | 20.6 | 30.3 | 30.0 | 0.0 | | B | C |

From the results shown in Table 5 above, it was found that in a case where no additive is added, the contrast of an image display device is deteriorated (Comparative Examples 1 and 2).

In addition, it was found that in a case where the additive is blended but Expression (1-1) is not satisfied, the contrast of an image display device is improved, but the surface condition of an optically anisotropic layer is deteriorated (Comparative Examples 3 and 4).

In contrast, it was found that in a case where the additive is blended and Expression (1-1) is satisfied, the surface condition of an optically anisotropic layer is excellent and the contrast of an image display device is also good (Examples 1 to 8).

In particular, from the comparison between Example 2 and Example 3, it was found that in a case where a polymer having a constitutional unit derived from a fluoroaliphatic group-containing monomer represented by Formula (3) is blended, the surface condition of an optically anisotropic layer is better and the contrast of an image display device is also better.

In addition, from the comparison between Example 2 and Example 4, it was found that in a case where the additive is a compound which has a polymerizable group at one terminal of the molecule and may have an aromatic ring which is not substituted at the other terminal of the molecule, the surface condition of an optically anisotropic layer is better.

Moreover, from the comparison between Example 5 and Example 6, it was found that an absolute value of the difference between an $SP_A$ indicating a solubility parameter value of the polymerizable smectic rod-shaped liquid crystal compound and an $SP_C$ indicating a solubility parameter value of the additive is 0.3, the surface condition of an optically anisotropic layer is better.

Furthermore, from the comparison between Example 7 and Example 8, it was found that in a case where the polyfunctional liquid crystal compound having three or more polymerizable groups was blended, the surface condition of an optically anisotropic layer is better.

EXPLANATION OF REFERENCES

10: optical film
12: optically anisotropic layer
14: alignment film
16: support

What is claimed is:

1. An optically anisotropic layer in which a polymerizable liquid crystal composition is immobilized in a liquid crystal state of a smectic phase, the polymerizable liquid crystal composition including a polymerizable rod-shaped liquid crystal compound exhibiting a liquid crystal state of a smectic phase and an additive,
wherein a molecular length A (Å) of the polymerizable rod-shaped liquid crystal compound, a layer interval B (Å) of the smectic phase of the optically anisotropic layer, and a molecular length C (Å) of the additive satisfy a relationship of Expression (1-1), $$0.5 \times B \leq C \leq 0.6 \times A \quad (1\text{-}1),$$

wherein the polymerizable rod-shaped liquid crystal compound is a compound represented by Formula (I) or any one of the following compounds (1-1) to (1-19),

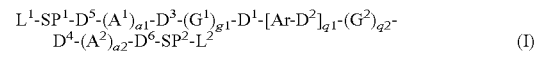

$$L^1\text{-}SP^1\text{-}D^5\text{-}(A^1)_{a1}\text{-}D^3\text{-}(G^1)_{g1}\text{-}D^1\text{-}[Ar\text{-}D^2]_{q1}\text{-}(G^2)_{g2}\text{-}D^4\text{-}(A^2)_{a2}\text{-}D^6\text{-}SP^2\text{-}L^2 \quad (I)$$

in Formula (I),
a1, a2, g1, and g2 each independently represent 0 or 1, provided that at least one of a1 or g1 represents 1, and at least one of a2 or g2 represents 1,
q1 represents 1 or 2,
$D^1$, $D^2$, $D^3$, $D^4$, $D^5$, and $D^6$ each independently represent a single bond; or —CO—, —O—, —S—, —C(=S)—, —CR$^1$R$^2$—, —CR$^3$=CR$^4$—, —NR$^5$—, or a divalent linking group consisting of a combination of two or more of these groups, where $R^1$ to $R^5$ each independently represent a hydrogen atom, a fluorine atom, or an alkyl group having 1 to 12 carbon atoms, provided that in a case where q1 is 2, a plurality of $D^2$'s may be the same as or different from each other,
$G^1$ and $G^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$-'s contained in the alicyclic hydrocarbon group may be substituted with —O—, —S—, or —NH—,
$A^1$ and $A^2$ each independently represent an aromatic ring having 6 to 20 carbon atoms, which may have a substituent, or a divalent alicyclic hydrocarbon group having 5 to 20 carbon atoms, which may have a substituent, and one or more of —CH$_2$-'s contained in the alicyclic hydrocarbon group may be substituted with —O—, —S—, or —NH—, SP$^1$ and SP$^2$ each independently represent a single bond, a linear alkylene group having 1 to 12 carbon atoms, a branched alkylene group having 3 to 12 carbon atoms, or a divalent linking group in which one or more of —CH$_2$-'s contained in the linear or branched alkylene group are substituted with —O—, —S—, —NH—, —N(Q)-, or —CO—, where Q represents a substituent, L$^1$ and L$^2$ each independently represent a monovalent organic group, and at least one of L$^1$ or L$^2$ represents a polymerizable group, provided that in a case where Ar is an aromatic ring represented by Formula (Ar-3), at least one of L$^1$ or L$^2$, or L$^3$ or L$^4$ in Formula (Ar-3) represents a polymerizable group, and Ar represents any of aromatic rings selected from the group consisting of groups represented by Formulae (Ar-1) to (Ar-7), provided that in a case where q1 is 2, a plurality of Ar's may be the same as or different from each other,

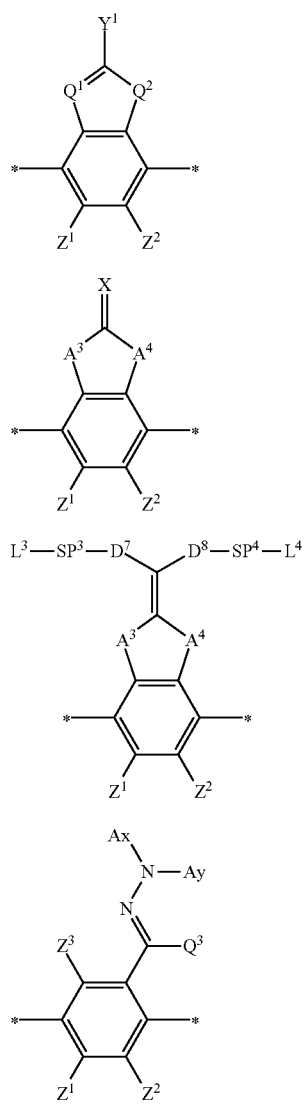

(Ar-1)

(Ar-2)

(Ar-3)

(Ar-4)

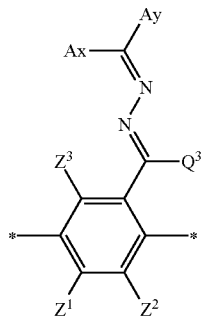

(Ar-5)

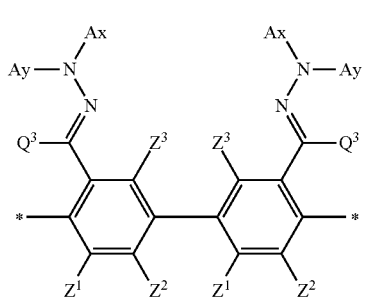

(Ar-6)

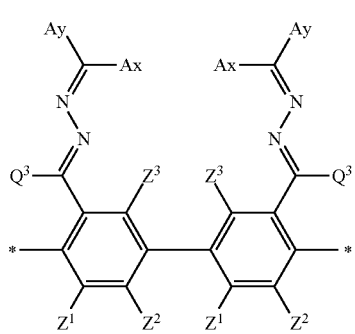

(Ar-7)

in Formulae (Ar-1) to (Ar-7),

* represents a bonding position, in a case where q1 represents 1, one of two * represents a bonding position to D$^1$, and the other represents a bonding position to D$^2$; in a case where q1 represents 2 and Ar exists between D$^1$ and D$^2$, one of two * represents a bonding position to D$^1$ and the other represents a bonding position to D$^2$; in a case where q1 represents 2 and Ar exists between two D$^2$, two * represent a bonding position to D$^2$, respectively, Q$^1$ represents N or CH, Q$^2$ represents -S—, —O—, or —N(R$^6$)—, where R$^6$ represents a hydrogen atom or an alkyl group having 1 to 6 carbon atoms, Y$^1$ represents an aromatic hydrocarbon ring having 6 to 12 carbon atoms, which may have a substituent, an aromatic heterocyclic group having 3 to 12 carbon atoms, which may have a substituent, or an alicyclic hydrocarbon group having 6 to 20 carbon atoms, which may have a substituent, and one or more of —CH$_2$-'s contained in the alicyclic hydrocarbon group may be substituted with —O—, —S—, or —NH—, Z$^1$, Z$^2$, and Z$^3$ each independently represent a hydrogen atom, a monovalent aliphatic hydrocarbon group having 1 to 20 carbon atoms, a monovalent alicyclic hydrocarbon group having 3 to 20 carbon atoms, a monovalent aromatic hydrocarbon group having 6 to 20 carbon atoms, a monovalent aromatic heterocyclic group having 6 to 20 carbon atoms, a halogen atom, a cyano group, a nitro group, —OR⁷, —NR⁸R⁹, —SR¹⁰, —COOR¹¹, or —COR¹², R⁷ to R¹² each independently represent a hydrogen atom or an alkyl group having 1 to 6 carbon atoms, and Z¹ and Z² may be bonded to each other to form an aromatic ring, A³ and A⁴ each independently represent a group selected from the group consisting of —O—, —N(R¹³)—, —S—, and —CO—, where R¹³ represents a hydrogen atom or a substituent, X represents a non-metal atom of Groups XIV to XVI, to which a hydrogen atom or a substituent may be bonded, D⁷ and D⁸ each independently represent a single bond; or —CO—, —O—, —S—, —C(=S)—, —CR¹R²—, —CR³=CR⁴—, —NR⁵—, or a divalent linking group consisting of a combination of two or more of these groups, where R¹ to R⁵ each independently represent a hydrogen atom, a fluorine atom, or an alkyl group having 1 to 12 carbon atoms, SP³ and SP⁴ each independently represent a single bond, a linear alkylene group having 1 to 12 carbon atoms, a branched alkylene group having 3 to 12 carbon atoms, or a divalent linking group in which one or more of —CH₂-'s contained in the linear or branched alkylene group are substituted with —O—, —S—, —NH—, —N(Q)-, or —CO—, where Q represents a substituent, L³ and L⁴ each independently represent a monovalent organic group, and at least one of L³ or L⁴ represents a polymerizable group, Ax represents an organic group having 2 to 30 carbon atoms, which has at least one aromatic ring selected from the group consisting of an aromatic hydrocarbon ring and an aromatic heterocyclic ring, Ay represents a hydrogen atom, an alkyl group having 1 to 12 carbon atoms, which may have a substituent, or an organic group having 2 to 30 carbon atoms, which has at least one aromatic ring selected from the group consisting of an aromatic hydrocarbon ring and an aromatic heterocyclic ring, the aromatic ring in each of Ax and Ay may have a substituent, and Ax and Ay may be bonded to each other to form a ring, and Q³ represents a hydrogen atom or an alkyl group having 1 to 20 carbon atoms, which may have a substituent, (1-1)

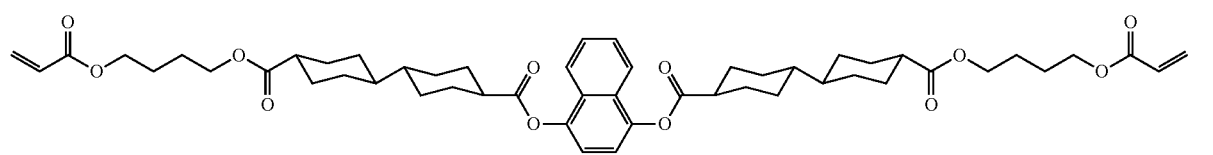

(1-2)

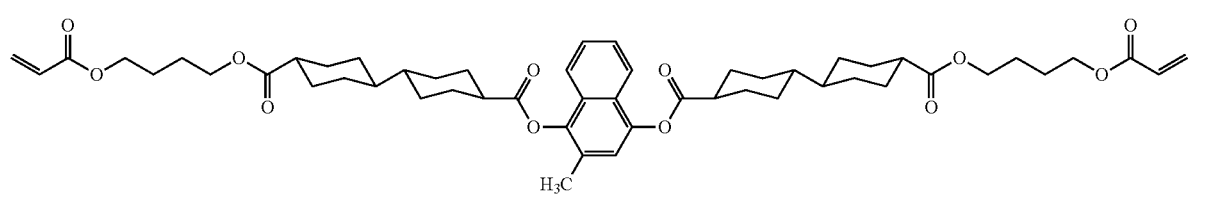

(1-3)

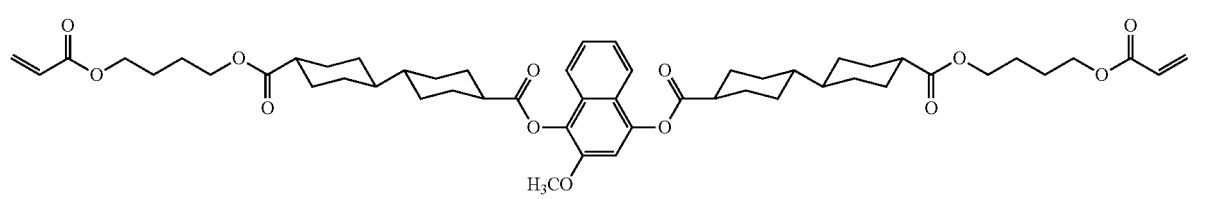

(1-4)

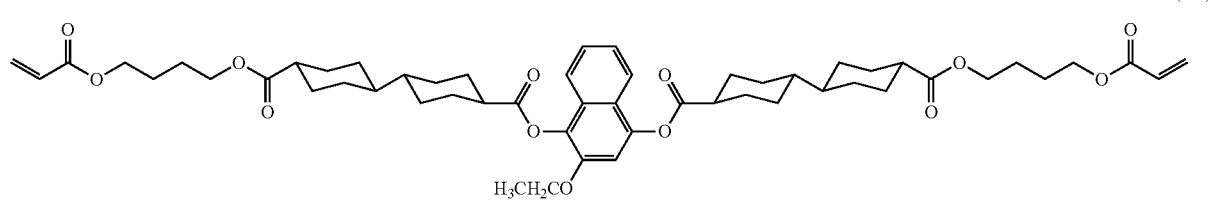

(1-5)

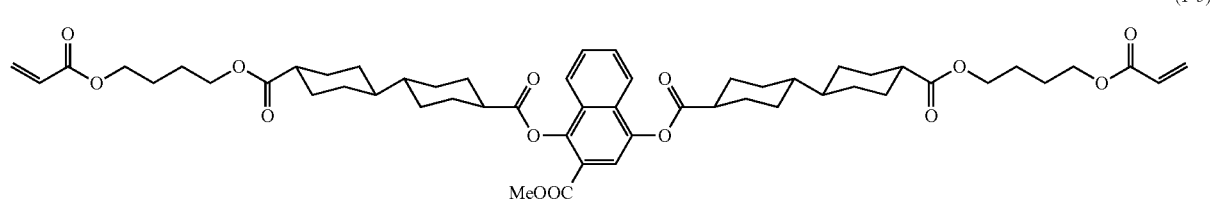

(1-6)
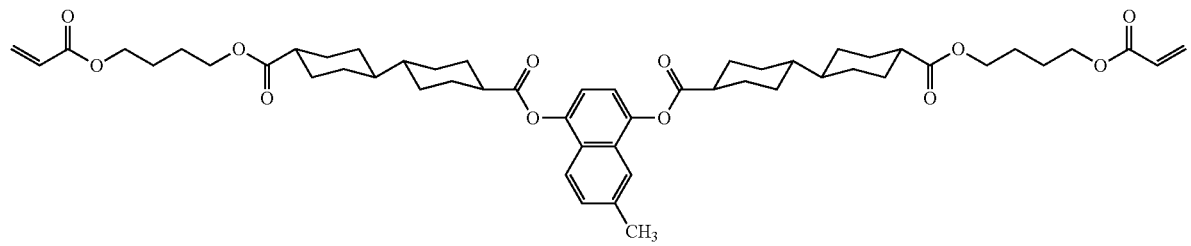
(1-7)
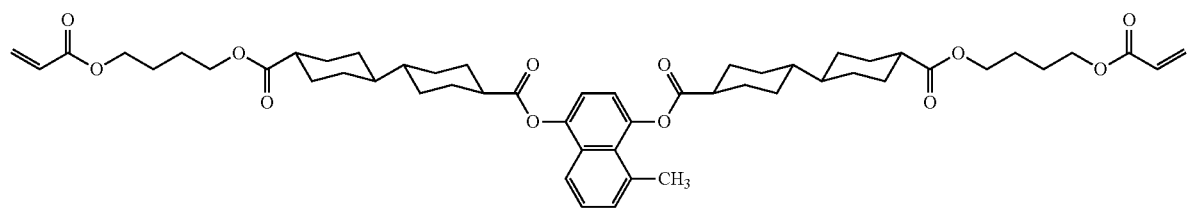
(1-8)
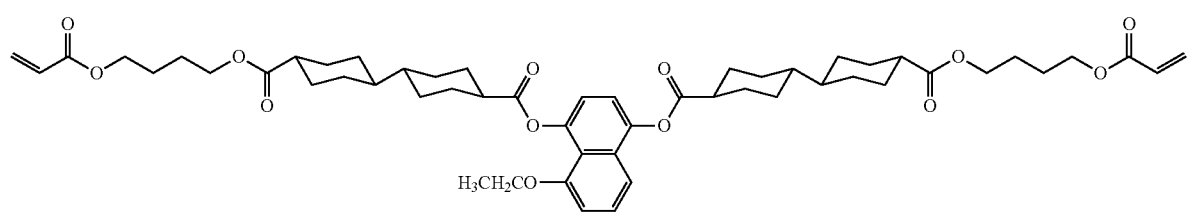
(1-9)
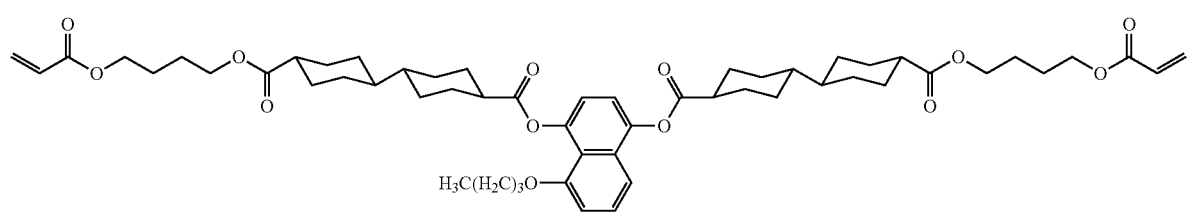
(1-10)
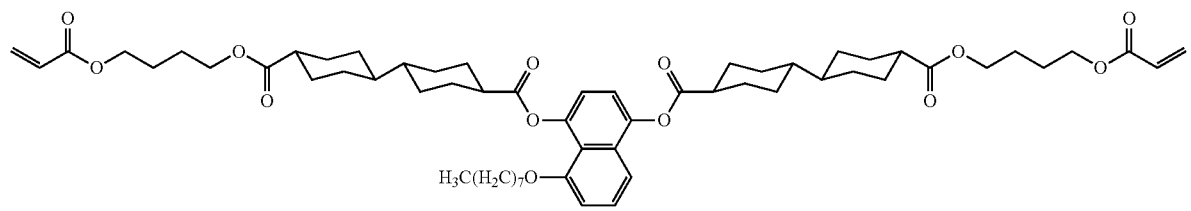
(1-11)
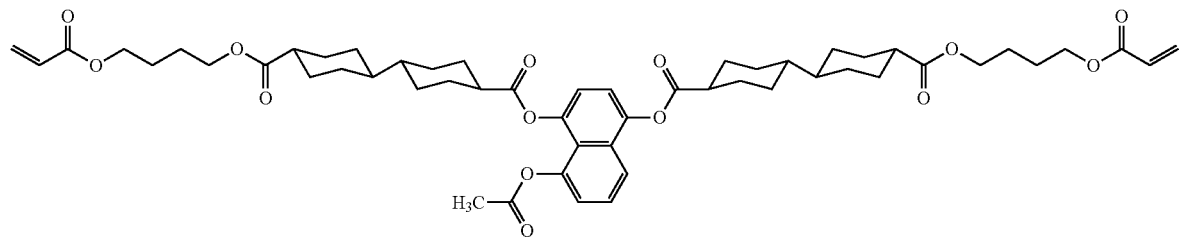

(1-12)
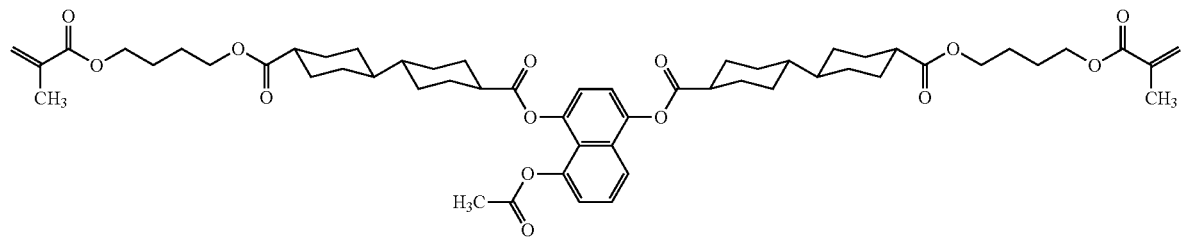
(1-13)
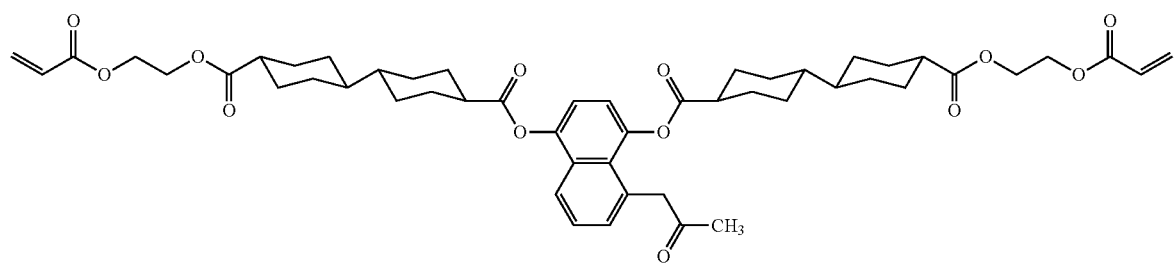
(1-14)
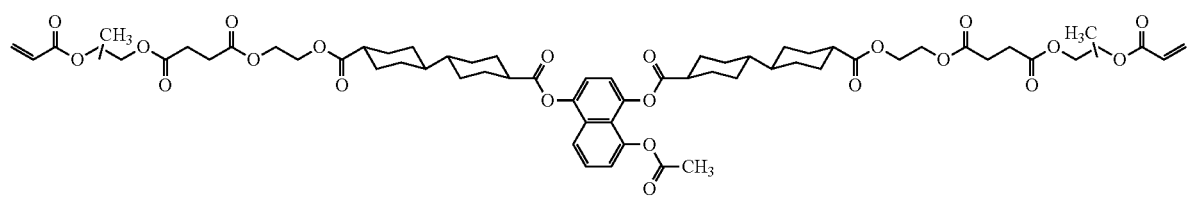
(1-15)
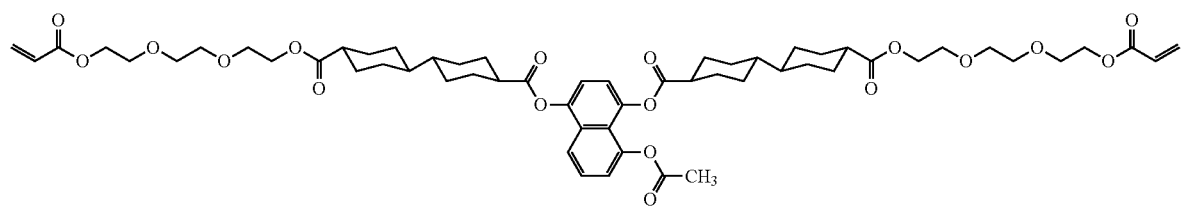
(1-16)
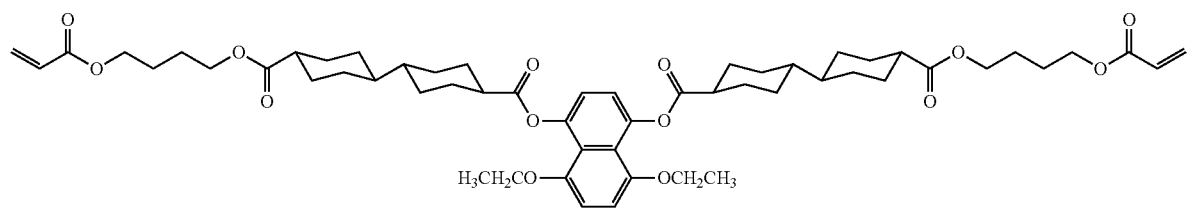
(1-17)
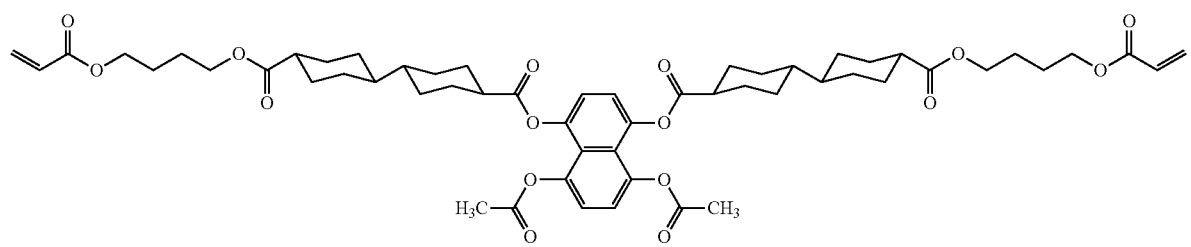

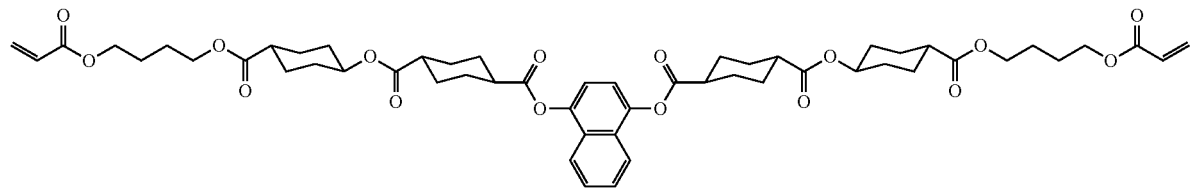
(1-18)

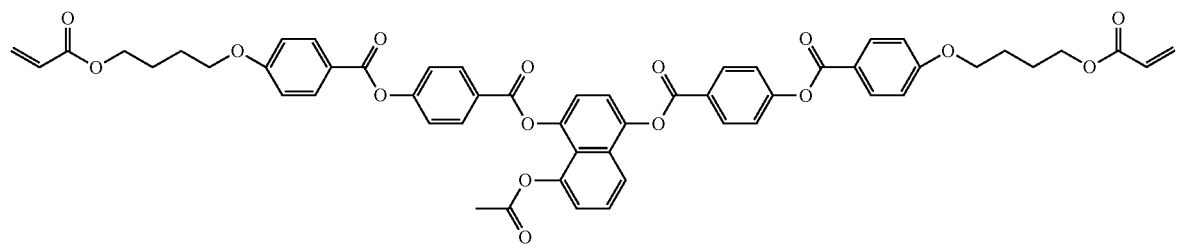
(1-19)

wherein the additive is a compound represented by Formula (II), $$L^5\text{-}SP^5\text{-}D^9\text{-}(A^5)_{a3}\text{-}D^{10}\text{-}(G^3)_{g3}\text{-}D^{11}\text{-}M \qquad (II),$$

in Formula (II), a3 and g3 each independently represent an integer of 0 to 2, provided that a3 and g3 represent integers of 1 to 3 in total, $D^9$, $D^{10}$, and $D^{11}$ each independently represent a single bond; or —CO—, —O—, —S—, —C(=S)—, —CR$^1$R$^2$—, —CR$^3$=CR$^4$—, —NR$^5$—, or a divalent linking group consisting of a combination of two or more of these groups, where $R^1$ to $R^5$ each independently represent a hydrogen atom, a fluorine atom, or an alkyl group having 1 to 12 carbon atoms, $G^3$ represents an aromatic ring having 6 to 20 carbon atoms, which may have a substituent, or a divalent alicyclic hydrocarbon group having 5 to 20 carbon atoms, which may have a substituent, and one or more of —CH$_2$-'s contained in the alicyclic hydrocarbon group may be substituted with —O—, —S—, or —NH—, it should be noted that in a case where g3 is 2, a plurality of G$^3$'s may be the same as or different from each other, $A^5$ represents an aromatic ring having 6 to 20 carbon atoms, which may have a substituent, or a divalent alicyclic hydrocarbon group having 5 to 20 carbon atoms, which may have a substituent, and one or more of —CH$_2$-'s contained in the alicyclic hydrocarbon group may be substituted with —O—, —S—, or —NH—, it should be noted that in a case where a3 is 2, a plurality of A$^5$'s may be the same as or different from each other, $SP^5$ represents a single bond, a linear alkylene group having 1 to 12 carbon atoms, a branched alkylene group having 3 to 12 carbon atoms, or a divalent linking group in which one or more of —CH$_2$-'s contained in the linear or branched alkylene group are substituted with —O—, —S—, —NH—, —N(Q)-, or —CO—, where Q represents a substituent, $L^5$ represents a polymerizable group, and M represents an aromatic ring which does not have a substituent, wherein the molecular length A of the polymerizable smectic rod-shaped liquid crystal compound and the molecular length C of the additive refer to values calculated by the following procedure, (1) specify the structure of a target compound to be calculated, (2) save a file in which the chemical formula of the target compound is created in a "MDLMolfile format", (3) open the saved MDLMolfile format file with a molecular modeling application, and optimize the structure by a simple molecular force field method, (4) the interatomic distance between both terminals of the target compound after the structural optimization is calculated as a molecular length, and wherein the layer interval B of the smectic phase of the optically anisotropic layer refers with the following devices under the following conditions, to a value calculated from an X-ray diffraction pattern derived from a smectic phase order, wherein devices and conditions include, X-ray diffractometer: X-ray diffractometer for thin film structure evaluation, Cu beam source: 50 kV·300 mA, and solar slit: 0.45.

2. The optically anisotropic layer according to claim 1, wherein the polymerizable liquid crystal composition contains a polymer having a constitutional unit derived from a fluoroaliphatic group-containing monomer represented by Formula (3),

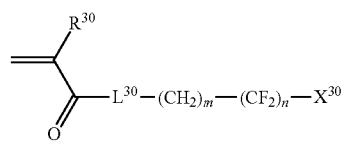
(3)

in Formula (3), $R^{30}$ represents a hydrogen atom or a methyl group, $L^{30}$ represents —O— or —NR$^{31}$—, where $R^{31}$ represents a hydrogen atom or an alkyl group having 1 to 6 carbon atoms, m represents an integer of 1 to 6, and n represents an integer of 1 to 18, and $X^{30}$ represents a hydrogen atom or a fluorine atom.

3. The optically anisotropic layer according to claim 1, wherein the polymerizable rod-shaped liquid crystal compound has reverse wavelength dispersion.

4. The optically anisotropic layer according to claim 1, wherein an $SP_A$ indicating a value of a solubility parameter of a partial structure represented by $L^1$-$SP^1$-$D^5$-$(A^1)_{a1}$-$D^3$-$(G^1)_{g1}$-$D^1$ in Formula (I) and an $SP_C$ indicating a value of a solubility parameter of the additive satisfy a relationship of Expression (2-1), $$|SP_A - SP_C| \leq 1.0 \qquad (2\text{-}1).$$

5. The optically anisotropic layer according to claim 1, wherein an $SP_A$ indicating a value of a solubility parameter of a partial structure represented by $L^1$-$SP^1$-$D^5$-$(A^1)_{a1}$-$D^3$-$(G^1)_{g1}$-$D^1$ in Formula (I) and an $SP_C$ indicating a value of a solubility parameter of the additive satisfy a relationship of Expression (2-2), $$|SP_A - SP_C| \leq 0.3 \qquad (2\text{-}2).$$

6. The optically anisotropic layer according to claim 1, wherein the polymerizable liquid crystal composition further contains a polyfunctional liquid crystal compound having three or more polymerizable groups.

7. An optical film comprising the optically anisotropic layer according to claim 1.

8. A polarizing plate comprising:
the optical film according to claim 7; and
a polarizer.

9. An image display device comprising the optical film according to claim 7.

10. An image display device comprising the polarizing plate according to claim 8.

11. The optically anisotropic layer according to claim 2, wherein the polymerizable rod-shaped liquid crystal compound has reverse wavelength dispersion.

12. The optically anisotropic layer according to claim 11, wherein an $SP_A$ indicating a value of a solubility parameter of a partial structure represented by $L^1$-$SP^1$-$D^5$-$(A^1)_{a1}$-$D^3$-$(G^1)_{g1}$-$D^1$ in Formula (I) and an $SP_C$ indicating a value of a solubility parameter of the additive satisfy a relationship of Expression (2-1), $$|SP_A - SP_C| \leq 1.0 \qquad (2\text{-}1).$$

13. The optically anisotropic layer according to claim 11, wherein an $SP_A$ indicating a value of a solubility parameter of a partial structure represented by $L^1$-$SP^1$-$D^5$-$(A^1)_{a1}$-$D^3$-$(G^1)_{g1}$-$D^1$ in Formula (I) and an $SP_C$ indicating a value of a solubility parameter of the additive satisfy a relationship of Expression (2-2), $$|SP_A - SP_C| \leq 0.3 \qquad (2\text{-}2).$$

14. The optically anisotropic layer according to claim 2, wherein the polymerizable liquid crystal composition further contains a polyfunctional liquid crystal compound having three or more polymerizable groups.

* * * * *